United States Patent
Tsuji et al.

(10) Patent No.: US 8,837,200 B2
(45) Date of Patent: Sep. 16, 2014

(54) NONVOLATILE SEMICONDUCTOR MEMORY DEVICE AND READ METHOD FOR THE SAME

(75) Inventors: Kiyotaka Tsuji, Osaka (JP); Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 15 days.

(21) Appl. No.: 13/700,346

(22) PCT Filed: Jun. 18, 2012

(86) PCT No.: PCT/JP2012/003957
§ 371 (c)(1),
(2), (4) Date: Nov. 27, 2012

(87) PCT Pub. No.: WO2013/001741
PCT Pub. Date: Jan. 3, 2013

(65) Prior Publication Data
US 2013/0148407 A1    Jun. 13, 2013

(30) Foreign Application Priority Data
Jun. 27, 2011    (JP) .................................. 2011-142373

(51) Int. Cl.
*G11C 11/00*    (2006.01)
*G11C 13/00*    (2006.01)

(52) U.S. Cl.
CPC .......... *G11C 13/004* (2013.01); *G11C 13/0002* (2013.01)
USPC ............................. 365/148; 365/158; 365/163

(58) Field of Classification Search
CPC ........... G11C 13/0002; G11C 13/0004; G11C 2213/71
USPC ................................. 365/148, 100, 158, 163
See application file for complete search history.

(56) References Cited

U.S. PATENT DOCUMENTS

| 6,259,644 B1 | 7/2001 | Tran et al. |
| 6,462,979 B2 | 10/2002 | Schlosser et al. |
| 6,678,187 B2 | 1/2004 | Sugibayashi et al. |

(Continued)

FOREIGN PATENT DOCUMENTS

| CN | 101111899 | 1/2008 |
| CN | 101256830 | 9/2008 |

(Continued)

OTHER PUBLICATIONS

Office Action and Search Report issued May 27, 2014 in corresponding Chinese patent application No. 201280001450.1 with English translation of Search Report.

*Primary Examiner* — Tan T. Nguyen
(74) *Attorney, Agent, or Firm* — Wenderoth, Lind & Ponack, LLP

(57) ABSTRACT

A nonvolatile semiconductor memory device includes: word lines; bit lines formed so as to three-dimensionally cross the word lines; and a cross-point cell array including cells each provided at a corresponding one of three-dimensional cross-points of the word lines and the bit lines. The cells include: a memory cell including a memory element that operates as a memory by reversibly changing in resistance value between at least two states based on an electrical signal; and an offset detection cell having a constant resistance value that is higher than the resistance value of the memory element in a high resistance state which is a state of the memory element when operating as the memory.

24 Claims, 17 Drawing Sheets

(56) References Cited

U.S. PATENT DOCUMENTS

| | | | |
|---|---|---|---|
| 6,847,568 B2 | 1/2005 | Gogl et al. | |
| 6,885,579 B2 * | 4/2005 | Sakimura et al. | 365/158 |
| 6,885,580 B2 * | 4/2005 | Baker | 365/158 |
| 7,245,526 B2 | 7/2007 | Oh et al. | |
| 7,248,494 B2 | 7/2007 | Oh et al. | |
| 7,561,461 B2 | 7/2009 | Nagai et al. | |
| 7,978,495 B2 | 7/2011 | Kawazoe et al. | |
| 8,565,005 B2 * | 10/2013 | Takagi et al. | 365/148 |
| 2001/0026469 A1 | 10/2001 | Schlosser et al. | |
| 2002/0126524 A1 | 9/2002 | Sugibayashi et al. | |
| 2004/0004856 A1 | 1/2004 | Sakimura et al. | |
| 2004/0218446 A1 | 11/2004 | Gogl et al. | |
| 2006/0050548 A1 | 3/2006 | Oh et al. | |
| 2006/0181915 A1 | 8/2006 | Oh et al. | |
| 2008/0205119 A1 | 8/2008 | Nagai et al. | |
| 2009/0129140 A1 | 5/2009 | Kawazoe et al. | |

FOREIGN PATENT DOCUMENTS

| | | |
|---|---|---|
| JP | 2001-297580 | 10/2001 |
| JP | 2002-216467 | 8/2002 |
| JP | 2004-39150 | 2/2004 |
| JP | 2004-522242 | 7/2004 |
| JP | 2006-79812 | 3/2006 |
| JP | 2006-228414 | 8/2006 |
| JP | 3821066 | 9/2006 |
| WO | 02/073618 | 9/2002 |

* cited by examiner

NONVOLATILE SEMICONDUCTOR MEMORY DEVICE AND READ METHOD FOR THE SAME

TECHNICAL FIELD

The present invention relates to cross-point nonvolatile semiconductor memory devices including variable resistance memory elements, and particularly relates to a cell array structure which improves the judging function of read signals and to a read method for use in the cell array structure.

BACKGROUND ART

Along with development of the digital technology, recent years have seen a further increase in functionality of electronic devices such as mobile information devices and information home appliances. Accordingly, there is an increasing demand for a nonvolatile memory device with a higher capacity, lower power consumption for writing, a higher speed of reading/writing, and a longer product lifetime.

In response to such a demand, an attempt to downsize a flash memory which includes an existing floating gate is under way.

Meanwhile, research and development have been directed toward, as an element which replaces the flash memory, a nonvolatile memory device which includes a memory element configured using what is called a variable resistance memory element. The variable resistance memory element indicates an element which has a resistance value changing according to electrical signals, has properties of keeping the resistance value even when the electrical signals are no longer supplied (that is, keeping the resistance value in a nonvolatile manner), and is capable of storing data using a change in this resistance value.

Representative examples of the variable resistance memory element include a magnetic random access memory (MRAM), a phase change random access memory (PRAM), a resistance random access memory (ReRAM; a variable resistance element), a spin transfer torque random access memory (SPRAM), and a conductive bridge random access memory (CBRAM).

As an example of the structures of the nonvolatile memory devices which include these variable resistance memory elements, a cross-point structure is known. In the cross-point structure, memory cells are arranged each of which has two terminals and is located at a cross-point between a bit line and a word line that are perpendicular to each other; the memory cell is located between the bit line and the word line. The memory cell is configured with a memory element that includes a variable resistance memory element as its single element or includes a series-connected combination of a variable resistance memory element with a two-terminal switching element, such as a diode, such that the memory element has one electrode connected to the word line and the other electrode connected to the bit line. The cross-point structure is characterized by being suitable for large-scale integration as compared to what is called the 1T1R structure in which each variable resistance memory element is connected to a bit line via an access transistor having three terminals.

In the cross-point structure, the memory cells are arranged in an array (which is hereinafter referred to as a cross-point cell array). In the cross-point structure, to detect (read) a resistance value of a memory element included in a target memory cell, a voltage is applied to a corresponding set of the bit line and the word line, which causes a current to flow not only in the target memory cell, but also in the other memory cells which are connected in parallel by upper and lower bit and word lines. The current flowing across the other memory cells is called a sneak current herein. Since the sneak current changes depending on the condition of data stored in the cross-point cell array (the resistance values and its distribution of the memory elements included in all the memory cells within the cross-point cell array to which the target memory cell belongs), the current detected upon reading always includes offset current (that is a sneak current) of which a value is always not constant. This sneak current impairs accurate detecting of the resistance value of the memory element included in the target memory cell to be read.

By configuring the memory element in which the switching element and the variable resistance memory element are connected in series, this sneak current can be reduced to some extent. However, the sneak current increases according to the size of the cross-point cell array, which means that the sneak current is an impediment to the enlargement of the cross-point cell array.

Patent Literature (PTL) 1 discloses a memory device configured to reduce sneak current-induced sensitivity deterioration in detecting a resistance value of the memory element included in the memory cell.

CITATION LIST

Patent Literature

[PTL 1] Japanese Patent No. 3,821,066

SUMMARY OF INVENTION

Technical Problem

In the memory device disclosed by PTL 1, a cross-point cell array 601 includes memory cells 602 and dummy cells 608 as shown in FIG. 18. The memory cells 602 and the dummy cells 608 are not different in structure, and the memory cells connected to a bit line defined as a dummy bit line 609 are used as the dummy cells. The memory element is MRAM.

A subtraction circuit 617 generates a current difference signal corresponding to a difference (Is−Ic) between a detecting electric current Is which flows through a selected bit line by application of a voltage between a selected word line and the selected bit line and an offset component electric current Ic which flows through the dummy bit line by application of a voltage between the selected word line and the dummy bit line. A read circuit 16 judges, based on this current difference signal, memory data stored in a selected cell 602a.

The offset component electric current Ic is a current having a value close to a value of the offset component included in the detecting electric current Is. The difference (Is−Ic) between the detecting electric current Is and the offset component electric current Ic has a high signal-to-noise ratio, with the result that the memory data stored in the selected cell 602a can be judged with high reliability when judged based on the current difference signal corresponding to the difference (Is−Ic).

In the above-described memory device, MRAM is used as the memory element. In the MRAM, the change amount of the resistance value is smaller than that in other variable resistance memory elements, the ratio of a resistance value (HR) in a high resistance state to a resistance value (LR) in a low resistance state is approximately 1.2 to 1.4, and the current component which is included in the current flowing across the selected cell and flows as attributed to a resistance component not dependent on the stored data is greater than the current which corresponds to the stored data. Furthermore, the memory cell used in the above-described memory device is composed of the MRAM only and includes no switching elements. Thus, the literature discloses that the current corresponding to the data stored in the selected cell 602a is about 1 μA while the offset component electric current Ic is about 30 μA.

However, in the above-described memory device, the offset component electric current included in the detecting electric current Is and the offset component electric current Ic which flows through the dummy bit line can be regarded substantially equal only when the above-described memory device satisfies the condition disclosed (that is, a condition that the electric current which is included in the current flowing across the selected cell and flows as attributed to the resistance component not dependent on the stored data has a greater value than the value of the current corresponding to the stored data and the offset component electric current has a significantly greater value than the value of the current corresponding to the data stored in the selected cell).

Generally, the offset component electric current is desirably as small as possible from the perspective of improvement in accuracy for reading, a reduction in power consumption, a reduction in line deterioration due to electromigration (improvement in reliability), a reduction in positional dependency of the memory cell current within the array along with the voltage drop caused by line resistance, enlargement of the cross-point cell array, and so on.

Furthermore, in the variable resistance memory device such as PRAM, ReRAM, and SPRAM, the ratio of resistance change between the LR state and the HR state is high (around one decade or more), and the current component (the sneak current component) which is included in the current flowing across the selected cell and flows as attributed to the resistance component not dependent on the stored data has a smaller value than the value of the current corresponding to the stored data.

From the foregoing description, it is clear that the structure of the memory device disclosed in PTL 1 does not produce the effects and is not applicable in other cases than the case where the memory element is composed of only the MRAM without switching elements.

In view of the above problems, the present invention has an object to provide a cross-point nonvolatile semiconductor memory device which includes a variable resistance memory element and is capable of reducing sneak current-induced sensitivity deterioration in detecting a resistance value of a memory element included in a memory cell, as well as to provide a read method for the cross-point nonvolatile semiconductor memory device.

Solution to Problem

In order to achieve the above object, the nonvolatile semiconductor memory device according to an aspect of the present invention comprises: word lines formed in parallel in a first plane; bit lines formed in parallel in a second plane and three-dimensionally crossing the word lines, the second plane being parallel to the first plane; and a cross-point cell array including cells each provided at a corresponding one of three-dimensional cross-points of the word lines and the bit lines, wherein the cells include: a memory cell including a memory element that operates as a memory by reversibly changing in resistance value between at least two states based on an electrical signal applied between a corresponding one of the word lines and a corresponding one of the bit lines; and an offset detection cell having a resistance value that is, irrespective of an electrical signal applied between a corresponding one of the word lines and a corresponding one of the bit lines, higher than the resistance value of the memory element in a high resistance state which is a state of the memory element when operating as the memory.

It is to be noted that the present invention can be implemented as a read method for the memory cell in the nonvolatile semiconductor memory device.

Advantageous Effects of Invention

The cross-point nonvolatile semiconductor memory device including the variable resistance memory element according to an aspect of the present invention is capable of reducing the problem of sneak current-induced sensitivity deterioration in detecting a resistance value of the memory element at the time of reading, which produces an effect of improving accuracy for reading.

BRIEF DESCRIPTION OF DRAWINGS

FIG. 3 is a cross-sectional view for explaining other configuring methods for an offset detection cell in an implementation of the present invention.

FIG. 4 is a cross-sectional view of a memory cell in an implementation of the present invention which is composed of ReRAM and an MSM diode.

FIG. 5 is a view for explaining a read method for the nonvolatile semiconductor memory device according to Embodiment 1 of the present invention.

FIG. 6 is a view for explaining the read method (sequel) for the nonvolatile semiconductor memory device according to Embodiment 1 of the present invention.

FIG. 7 is a read flowchart for the nonvolatile semiconductor memory device according to Embodiment 1 of the present invention.

FIG. 10 is a view for explaining a read method for the nonvolatile semiconductor memory device according to Variation of Embodiment 2 of the present invention.

FIG. 11 is a view for explaining the read method (sequel) for the nonvolatile semiconductor memory device according to Variation of Embodiment 2 of the present invention.

FIG. 12 is a view for explaining the read method (sequel) for the nonvolatile semiconductor memory device according to Variation of Embodiment 2 of the present invention.

FIG. 13 is a read flowchart for the nonvolatile semiconductor memory device according to Variation of Embodiment 2 of the present invention.

FIG. 15 is a view for explaining a read method for the nonvolatile semiconductor memory device according to Embodiment 3 of the present invention.

FIG. 16 is a view for explaining the read method (sequel) for the nonvolatile semiconductor memory device according to Embodiment 3 of the present invention.

FIG. 17 is a read flowchart for the nonvolatile semiconductor memory device according to Embodiment 3 of the present invention.

FIG. 18 shows a structure of a conventional nonvolatile semiconductor memory device.

Figure 1:
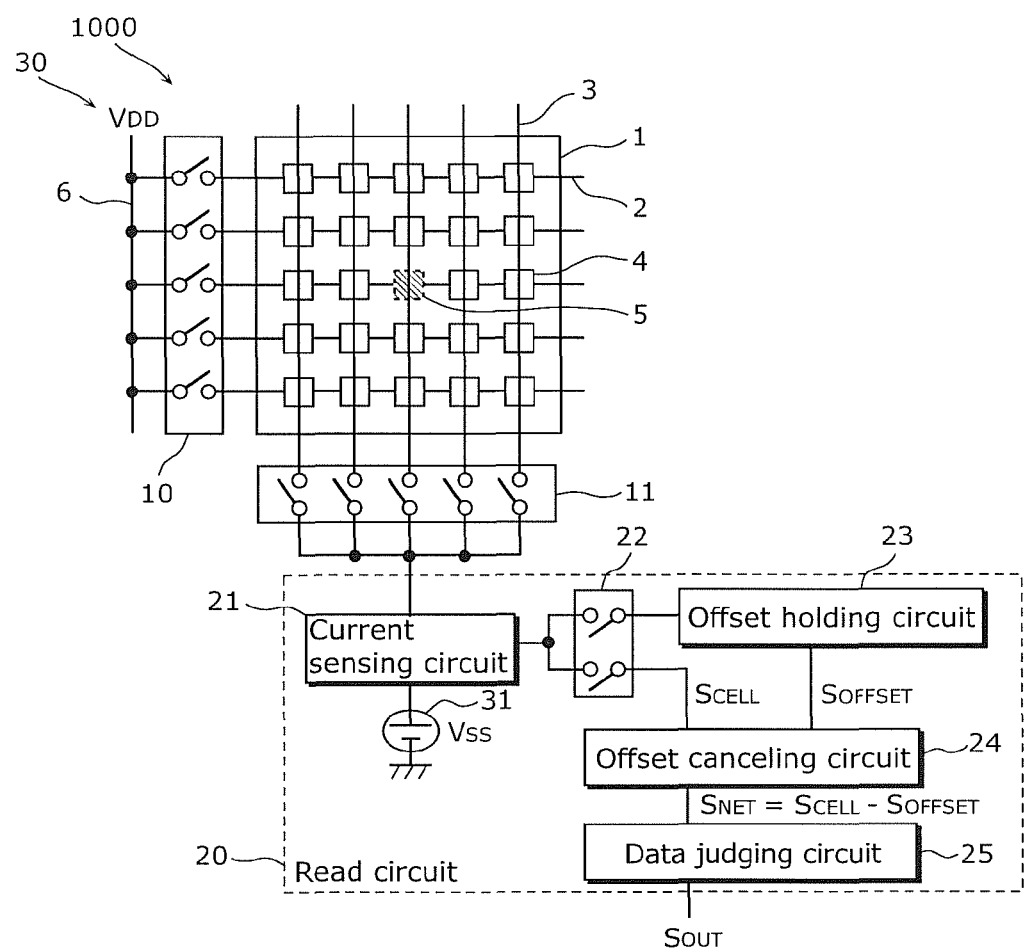
[FIG. 1] FIG. 1 schematically shows a structure of a nonvolatile semiconductor memory device according to Embodiment 1 of the present invention.

DESCRIPTION OF EMBODIMENTS (Outline of the Present Invention)

A nonvolatile semiconductor memory device in an implementation of the present invention comprises: word lines formed in parallel in a first plane; bit lines formed in parallel in a second plane and three-dimensionally crossing the word lines, the second plane being parallel to the first plane; and a cross-point cell array including cells each provided at a corresponding one of three-dimensional cross-points of the word lines and the bit lines, wherein the cells include: a memory cell including a memory element that operates as a memory by reversibly changing in resistance value between at least two states based on an electrical signal applied between a corresponding one of the word lines and a corresponding one of the bit lines; and an offset detection cell having a resistance value that is, irrespective of an electrical signal applied between a corresponding one of the word lines and a corresponding one of the bit lines, higher than the resistance value of the memory element in a high resistance state which is a state of the memory element when operating as the memory.

With this, there is the offset detection cell which has a resistance value that is, irrespective of an electrical signal applied between a corresponding one of the word lines and a corresponding one of the bit lines, higher than the resistance value of the memory element in a high resistance state which is a state of the memory element when operating as a memory, with the result that subtracting the current detected when the offset detection cell is selected from the current detected when the memory element is selected leads to accurate detecting of current with the sneak current removed and thereby improves the accuracy for reading in the nonvolatile semiconductor memory device.

More specifically, the nonvolatile semiconductor memory device in an implementation of the present invention comprises: word lines formed in parallel in a first plane; bit lines formed in parallel in a second plane parallel to the first plane, and three-dimensionally crossing the word lines; a cross-point cell array including cells each provided at a corresponding one of three-dimensional cross-points of the word lines and the bit lines; a word line selector that selects one of the word lines as a selected word line; a bit line selector that selects one of the bit lines as a selected bit line; and a read circuit.

The cells include: a memory cell including a memory element that operates as a memory by reversibly changing in resistance value between at least two states based on an electrical signal applied between a corresponding one of the word lines and a corresponding one of the bit lines; and an offset detection cell having a resistance value that is, irrespective of an electrical signal applied between a corresponding one of the word lines and a corresponding one of the bit lines, higher than the resistance value of the memory element in a state in which the memory element has the highest possible resistance when operating as the memory.

The read circuit judges memory data stored in a read-target memory cell, based on a judging signal $S_{NET}$ which corresponds to a value obtained by subtracting a value of an offset electrical signal $S_{OFFSET}$ from a value of a memory cell electrical signal $S_{CELL}$. The read-target memory cell is selected by the word line selector and the bit line selector from the cross-point cell array. The offset electrical signal $S_{OFFSET}$ is an electrical signal that corresponds to a value of a current flowing through a second selected bit line when a read voltage is applied between a second selected word line and the second selected bit line. The memory cell electrical signal $S_{CELL}$ is an electrical signal that corresponds to a value of a current flowing through a first selected bit line when the read voltage is applied between a first selected word line and the first selected bit line. The second selected word and bit lines correspond to the offset detection cell. The first selected word and bit lines correspond to the read-target memory cell.

With this, the judging signal $S_{NET}$ is obtained by removing, from the memory cell electrical signal $S_{CELL}$, a component of the offset electrical signal $S_{OFFSET}$ corresponding to the offset component which changes dynamically, with the result that a significant improvement can be seen in the signal-to-noise ratio, and the accuracy for reading in the nonvolatile semiconductor memory device is higher, as compared to the case where the memory cell electrical signal $S_{CELL}$ is used directly as a judging signal.

Here, the above nonvolatile semiconductor memory device includes, as a reading process for the memory cell: a first process of determining whether data stored in the memory cell included in a cross-point cell array has been changed since detection of a value of an offset electrical signal that corresponds to a value of a current flowing through a second selected bit line when a read voltage is applied between a second selected word line and the second selected bit line; a second process of, when it is determined that the data has been changed, (i) selecting the second selected word line and the second selected bit line, (ii) detecting a value of an offset electrical signal that corresponds to a value of a current flowing through the second selected bit line, and (iii) storing the offset electrical signal into an offset holding circuit; a third process of (i) selecting the first selected word line and the first selected bit line, and (ii) detecting a value of a memory cell electrical signal that corresponds to a value of a current flowing through the first selected bit line, after completion of the first process when it is determined that the data has not been changed, or after completion of the second process when it is determined that the data has been changed; a fourth process of calculating a judging signal by an offset canceling circuit using the memory cell electrical signal and the offset electrical signal held in the offset holding circuit; and a fifth process of judging, based on a value of the judging signal, data stored in the read-target memory cell, by a data judging circuit.

The use of the above processes allows, in consecutive reading operations which do not involve data changes (i.e., writing into the memory cell), omission of an operation of selecting the offset detection cell and storing the offset electrical signal except in the initial cycle, which is therefore effective in improving the speed for reading (Embodiment 1).

Furthermore, the nonvolatile semiconductor memory device in another embodiment of the present invention may be configured such that offset detection cells are arranged in a one-to-one correspondence with the word lines and in a one-to-one correspondence with the bit lines.

With this structure, the read-target cell and the offset detection cell share one of the word line and the bit line, which means that the current $I_{OFFSET}$ detected by the offset detection cell has a value close to the value of the sneak current component $I_{SNEAK}$ included in the current $I_{CELL}$ detected when the read-target cell is selected, with the result that an improvement can be seen in the signal-to-noise ratio (Embodiment 2).

Furthermore, in the above nonvolatile semiconductor memory device, the read circuit may have a function of judging memory data stored in a read-target memory cell, based on a judging signal which corresponds to a value obtained by subtracting, from a value of a memory cell electrical signal $S_{CELL}$, a value of an offset electrical signal determined from a value of a first offset electrical signal $S_{OFFSET1}$ and a value of a second offset electrical signal $S_{OFFSET2}$. The first offset electrical signal $S_{OFFSET1}$ is an electrical signal corresponding to a value of a current flowing through a second selected bit line when a read voltage is applied between a first selected word line and the second selected bit line. The second offset electrical signal $S_{OFFSET2}$ is an electrical signal corresponding to a value of a current flowing through the first selected bit line when the read voltage is applied between a second selected word line and the first selected bit line. The second selected bit line corresponds to a first offset detection cell provided for the first selected word line, and the second selected word line corresponds to a second offset detection cell provided for the first selected bit line.

With this, the use of two offset detection cells, that is, the offset detection cell which shares a word line with the read-target memory cell and the offset detection cell which shares a bit line with the read-target memory cell, allows further accurate detecting of the offset current component in the read-target memory cell, which produces the effect of a further improvement in the signal-to-noise ratio (Variation of Embodiment 2).

Furthermore, the nonvolatile semiconductor memory device in yet another embodiment of the present invention may be configured such that the bit lines include offset detection bit lines, and the offset detection cell includes offset detection cells which are arranged in the cross-point cell array in a one-to-one correspondence with the word lines and each of which is provided for one of the offset detection bit lines.

Furthermore, as in the above structure where the offset detection cells are connected only to the particular offset detection bit line, it may be that the word lines include offset detection word lines, and the offset detection cell includes offset detection cells which are arranged in the cross-point cell array in a one-to-one correspondence with the bit lines and each of which is provided for one of the offset detection word lines.

With this structure, upon selecting the offset detection cell, the bit line selector can limit the target bit lines to only the offset detection bit line while maintaining the effect of an improvement in the signal-to-noise ratio, which produces an effect of facilitating the designing of a circuit which selects a switch in the bit line selector (Embodiment 3).

It is to be noted that the nonvolatile semiconductor memory device according to an implementation of the present invention does not necessarily include the word line selector, the bit line selector, and the read circuit, as long as a cross-point cell array characterized as described above is included. The cross-point cell array includes: a memory cell including a memory element (such as ReRAM, MRAM, PRAM, SPRAM, or CBRAM) that operates as a memory by reversibly changing in resistance value between at least two states based on an electrical signal applied between a corresponding one of the word lines and a corresponding one of the bit lines; and an offset detection cell having a resistance value that is, irrespective of an electrical signal applied between a corresponding one of the word lines and a corresponding one of the bit lines, higher than the resistance value of the memory element in a high resistance state which is a state of the memory element. This is a structure that can detect the sneak current with high accuracy unlike a conventional cross-point cell array which includes a memory cell and a dummy cell that are not different in structure.

Furthermore, a read method for a memory cell in a nonvolatile semiconductor memory device according to an aspect of the present invention is a read method for the memory cell in the above nonvolatile semiconductor memory device and comprises: (i) selecting a word line and a bit line between which an offset detection cell is provided, (ii) detecting a value of an offset electrical signal that corresponds to a value of a current flowing through the selected bit line, and (iii) storing the value of the offset electrical signal into an offset holding circuit; (i) selecting a word line and a bit line between which a read-target memory cell is provided, and (ii) detecting a value of a memory cell electrical signal that corresponds to a value of a current flowing through the selected bit line; calculating a judging signal by an offset canceling circuit using the value of the memory cell electrical signal and the value of the offset electrical signal held in the offset holding circuit; and judging, based on a value of the judging signal, data stored in the read-target memory cell, by a data judging circuit.

With this, the use of the offset detection cell provided in the cross-point cell array allows the data stored in the read-target memory cell to be judged based on the value of the memory cell electrical signal and the value of the offset electrical signal, with the result that the accuracy for reading in the nonvolatile semiconductor memory device improves.

(Embodiments)

Hereinafter, Embodiments of the present invention are described with reference to the Drawings. It is to be noted that each of Embodiments described hereinafter illustrates one specific example of the present invention. The numerical values, shapes, materials, structural elements, the arrangement and connection of the structural elements, steps, the processing order of the steps etc. shown in the following embodiments are mere examples, and therefore are not intended to limit the present invention. Among the structural elements in the following embodiments, structural elements not recited in any one of the independent claims defining the most generic concept are described as arbitrary structural elements.

Furthermore, the same elements are denoted by the same numerals and may not be repeatedly described.

In addition, the shapes of the memory elements, the lines, and so on described herein are schematic. Moreover, the number and the like of these elements and so on are set to those which facilitate illustration.

It is to be noted that although only a single-layered cross-point cell array is described herein with reference to the Drawing, the present invention is not limited to the single-layered cross-point cell array, and a cross-point cell array with two or more layers can also produce the same effects when the structure of the present invention is applied to each of the layers of the cross-point cell array.

(Embodiment 1)

[Device Structure]

A nonvolatile semiconductor memory device 1000 according to Embodiment 1 of the present invention includes, as shown in FIG. 1: word lines 2 formed in parallel in a first plane; bit lines 3 formed in parallel in a second plane parallel to the first plane, and three-dimensionally crossing the word lines 2; a cross-point cell array 1 including cells (a memory cell 4 and an offset detection cell 5) each provided at a corresponding one of three-dimensional cross-points of the word lines 2 and the bit lines 3; a word line selector 10 that selects one of the word lines 2 as a selected word line; a bit line selector 11 that selects one of the bit lines 3 as a selected bit line; and a read circuit 20.

Here, the cells include: the memory cell 4 including a memory element that reversibly changes in resistance value between at least two states (i.e., operating as a memory) based on an electrical signal applied between a corresponding one of the word lines 2 and a corresponding one of the bit lines 3; and the offset detection cell 5 which has a resistance value that is, irrespective of an electrical signal applied between the corresponding word line 2 and the corresponding bit line 3, higher than the resistance value of the memory element in a high resistance state which is a state of the memory element when operating as the memory. It is to be noted that the memory cell 4 is a memory cell included in the cross-point cell array 1, that is, a two-terminal memory cell, and includes a variable resistance memory element as its single element or includes a series-connected combination of a variable resistance memory element with a two-terminal switching element such as a diode. The diode may be a unidirectional diode across which a current flows only in a single direction. Alternatively, the diode may be a bidirectional diode which has a threshold voltage in each of the positive and negative directions and across which a current can flow in the both directions by application of a voltage higher than or equal to the threshold voltage.

Furthermore, the read circuit 20 has a function of judging memory data stored in a read-target memory cell, based on a judging signal $S_{NET}$ which corresponds to a value obtained by subtracting a value of an offset electrical signal $S_{OFFSET}$ from a value of a memory cell electrical signal $S_{CELL}$. The read-target memory cell is selected by the word line selector 10 and the bit line selector 11 from the cross-point cell array 1. The offset electrical signal $S_{OFFSET}$ is an electrical signal determined from a value of a current flowing through a second selected bit line when a read voltage is applied between a second selected word line and the second selected bit line. The memory cell electrical signal $S_{CELL}$ is an electrical signal that corresponds to a value of a current flowing through a first selected bit line when the read voltage is applied between a first selected word line and the first selected bit line. The second selected word and bit lines correspond to the offset detection cell 5 that is at least one in number. The first selected word and bit lines correspond to the read-target memory cell. The following describes each of the structural elements in detail.

This nonvolatile semiconductor memory device 1000 includes, as described above: the word lines 2 formed in parallel; the bit lines 3 formed in parallel in the direction in which the bit lines 3 cross the word lines 2; and the cross-point cell array 1 formed at the cross-points, in a planar view, of the word lines 2 and the bit lines 3 and between the word lines 2 and the bit lines 3. Furthermore, the cross-point cell array 1 includes the plurality of memory cells 4 and one or more offset detection cells 5.

It is to be noted that although the offset detection cell 5 is located at the center in the cross-point cell array 1 shown in FIG. 1, the offset detection cell 5 is not necessarily located at the center and may be located at any position within the cross-point cell array 1. Furthermore, the number of offset detection cells 5 within the cross-point cell array 1 is not limited to one, and two or more offset detection cells 5 may be provided within the single cross-point cell array 1.

Figure 2:
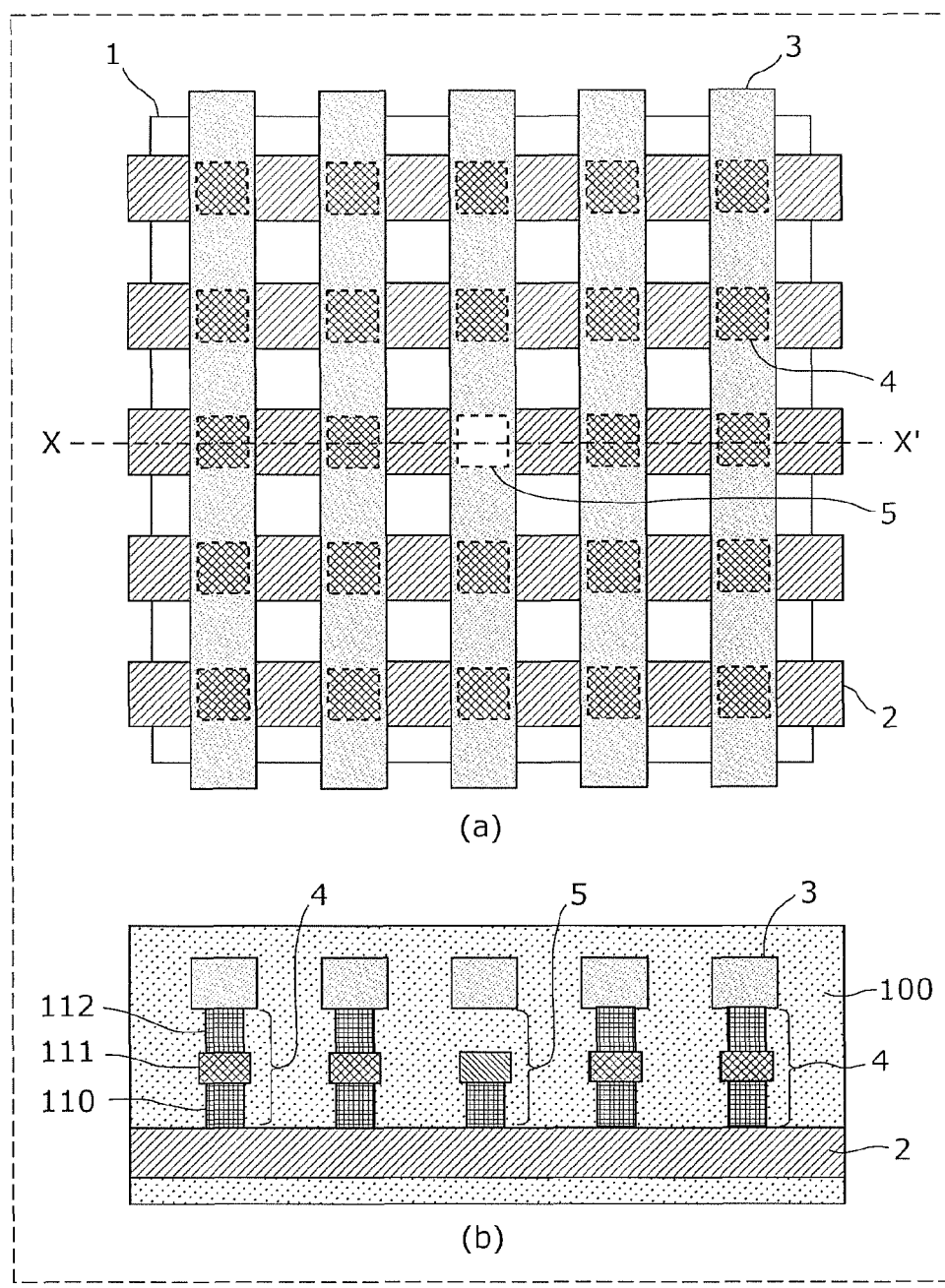
[FIG. 2] (a) in FIG. 2 is a plan view showing details of structures of a cross-point cell array, word lines, and bit lines, of the nonvolatile semiconductor memory device according to Embodiment 1 of the present invention, and (b) in FIG. 2 is a cross-sectional view showing a structure of a cross-section taken along X-X' of (a) in FIG. 2.

FIG. 2 shows, in more detail, the structures of the cross-point cell array 1, the word lines 2, and the bit lines 3 shown in FIG. 1. (a) of FIG. 2 is a plan view, and (b) of FIG. 2 shows a structure of a cross-section taken along X-X' of (a) in FIG. 2. As shown in (a) and (b) of FIG. 2, the memory cell 4 in this embodiment includes: a memory element 111; a first via 110 for electrically connecting the memory element 111 and the word line 2; and a second via 112 for electrically connecting the memory element 111 and the bit line 3.

The memory element 111 includes a variable resistance memory element or a series-connected combination of a variable resistance memory element and a switching element. The variable resistance memory element used herein indicates an element in which a value of resistance between two terminals changes according to electrical signals and which has properties of keeping the resistance value even when the electrical signals are no longer supplied (that is, keeping the resistance value in a nonvolatile manner), and is capable of storing data by this change in resistance value. Usable examples of the memory element 11 specifically include a magnetic random access memory (MRAM), a phase change random access memory (PRAM), a resistance random access memory (ReRAM), a spin transfer torque random access memory (SPRAM), and a conductive bridge random access memory (CBRAM). The variable resistance memory element in the memory element 111 associates one of the high resistance (HR) state and the low resistance (LR) state with "1" and the other with "0", which allows the memory element 111 to store one-bit data.

Furthermore, usable examples of the switching element herein include elements having non-linear switching properties, such as a metal-semiconductor-metal (MSM) diode which has a three-layer structure: a semiconductor layer and metal electrode layers (i.e., a first metal electrode and a second metal electrode) between which the semiconductor layer is located, a metal-insulator-metal (MIM) diode which has a three-layer structure: an insulator layer and metal electrode layers between which the insulator layer is located, a p-n junction diode which has a two-layer structure: a p-type semiconductor and an n-type semiconductor, and a Schottky diode which has a two-layer structure: a semiconductor layer and a metal electrode layer.

The offset detection cell 5 has, as an example, a structure obtained by removing the second via 112 from the memory cell 4. A role of the offset detection cell 5, which will be described in detail later, is to measure an approximate value of a sneak current in the cross-point cell array 1. I is sufficient that the offset detection cell 5 has a structure in which a current flowing across the offset detection cell 5 when a potential difference for reading is given between the word line 2 and the bit line 3 which are located above and below the offset detection cell 5 has a value smaller than a value of a current flowing across the memory cell 4 when a potential difference for reading is given between the word line 2 and the bit line 3 which are located above and below the memory cell 4 while the variable resistance memory element included in the memory element 111 is in a high resistance state. In other words, the offset detection cell 5 is configured to have a resistance value that is, irrespective of an electrical signal applied between a corresponding one of the word lines 2 and a corresponding one of the bit lines 3, higher than the resistance value of the memory element that is included in the memory cell 4 and is in a high resistance state which is a state of the memory element when operating as a memory.

The offset detection cell 5 shown in (b) of FIG. 2 is configured without the second via 112 as compared to the structure of the memory cell 4 such that almost no current flows across the offset detection cell 5 when a potential difference for reading is given between the word line 2 and the bit line 3 which are located above and below the offset detection cell 5. In this case, until the memory element 111 and an interlayer insulating film 100 thereon are formed, there is no difference in manufacture between the memory cell 4 and the offset detection cell 5, which makes it possible eliminate the influence of variations in size and properties of resultant memory elements due to differences in layout between the memory cell 4 to which only the memory cells 4 are adjacent and the memory cell 4 to which the offset detection cell 5 is adjacent.

Figure 3:
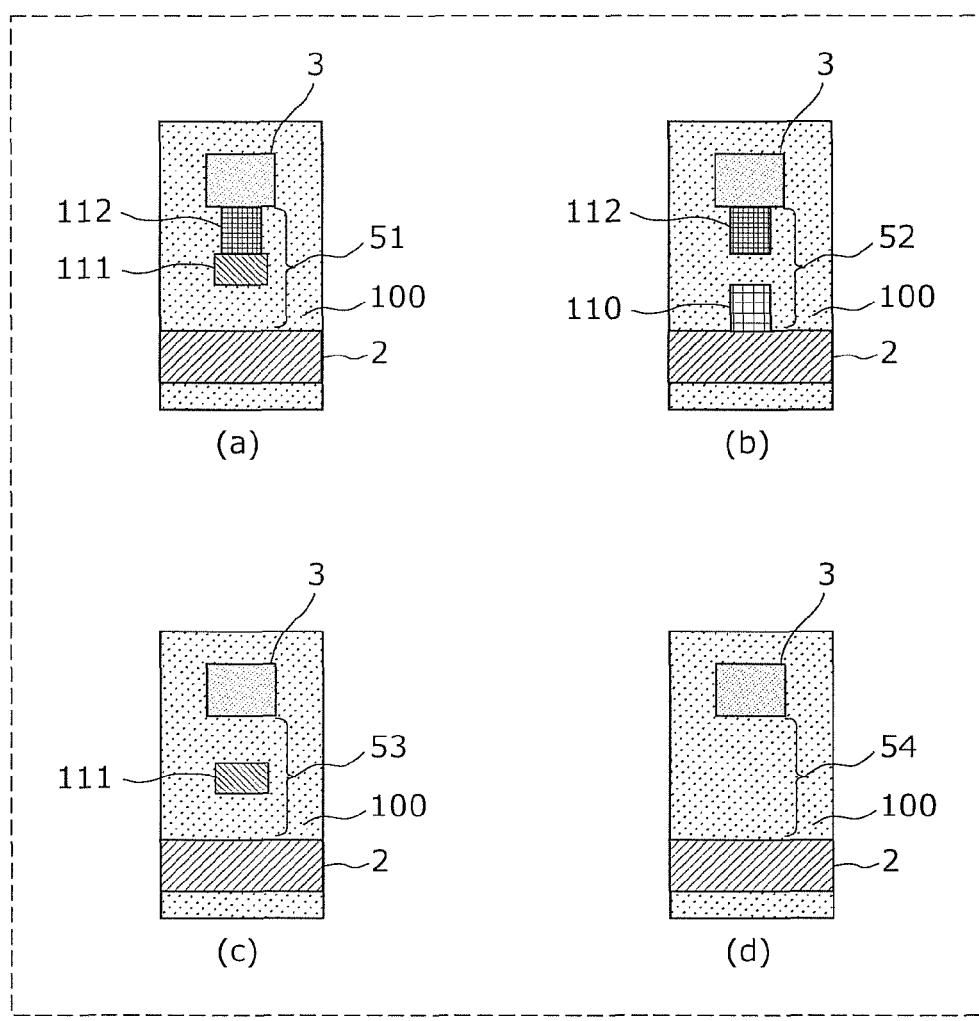
[FIG. 3]

FIG. 3 shows, in (a) to (d), other examples of the structure of the offset detection cell 5. As compared to the structure of the memory cell 4, an offset detection cell 51 in (a) of FIG. 3 has a structure without a via for electrically connecting the memory element 111 and the word line 2. An offset detection cell 52 in (b) of FIG. 3 has a structure without the memory element 111. An offset detection cell 53 in (c) of FIG. 3 has a structure without both the vias for electrically connecting the memory element 11 with the word line 2 and the bit line 3 which are located above and below the offset detection cell 53. Furthermore, an offset detection cell 54 in (d) of FIG. 3 has a structure without the memory cell, the upper via, nor the lower via. In all the structures, the current hardly flows across the offset detection cell 5 even when a potential difference for reading is given between the word line 2 and the bit line 3 which are located above and below the offset detection cell 5, the same or like effects as those in the offset detection cell 5 shown in (b) of FIG. 2 can be obtained.

The structures of the offset detection cells 51 to 53 in (a), (b), and (c) of FIG. 3 produce effects of reducing the possibility that the offset detection cells 51 to 53 are each short-circuited to the word line 2 in the lower layer even when a line groove which is to be the bit line 3 is overetched upon forming the bit line 3 in a damascene pattern using copper (Cu), as compared to the structure of the offset detection cell 5 shown in (b) of FIG. 2.

Furthermore, in the structure in (b) of FIG. 3, even in the case where the first via 110 is formed of a tungsten (W) via and a Cu via, the dishing amount of the offset detection cell 52 can be the same as that of the memory cell 4, which produces an effect of reducing local variations in focus margin in the lithography step for the memory element 111. Furthermore, in the structure in (c) FIG. 3, since no via is formed either above or below the memory element 111, the offset detection cell 53 will not be short-circuited even when overetching occurs at the time of via etching. Furthermore, in (d) of FIG. 3, short-circuiting of the offset detection cell 54 due to variations in the manufacturing process can be prevented at the highest rate.

The nonvolatile semiconductor memory device 1000 in FIG. 1 further includes the word line selector 10 and the bit line selector 11. The word line selector 10 is connected to the word lines 2 and selects one of the word lines 2 to connect only the selected one of the word lines (that is, a selected word line) to a power supply line 6 while leaving the other word lines in the unconnected state, for example. To the power supply line 6, potential VDD is given from a power supply 30. The bit line selector 11 is connected to the bit lines 3 and selects one of the bit lines 3 to connect only the selected one of the bit lines (that is, a selected bit line) to a current sensing circuit 21 while leaving the other bit lines in the unconnected state, for example.

The nonvolatile semiconductor memory device 1000 in FIG. 1 further includes the read circuit 20. This read circuit 20 is a circuit which reads data stored in a read-target memory cell selected by the word line selector 10 and the bit line selector 11 from the cross-point cell array 1, and includes the current sensing circuit 21, a sensing signal selector 22, an offset holding circuit 23, an offset canceling circuit 24, and a data judging circuit 25.

Furthermore, to the current sensing circuit 21, potential VSS is given from a power supply 31. Thus, owing to the potential difference (VDD−VSS), a current flows through the word line 2 and the bit line 3. The current flowing in the bit line selector 11-side end of the bit line selected by the bit line selector 11 is input to the current sensing circuit 21 through the bit line selector 11. The current sensing circuit 21 outputs an electrical signal that corresponds to a value of the input current, that is, an electrical signal that corresponds to a value of the current flowing through the selected bit line.

The sensing signal selector 22 has a function of selecting one of the offset holding circuit 23 and the offset canceling circuit 24 to which the electrical signal output from the current sensing circuit 21 is to be transmitted (that is, selecting where to output the electrical signal), as necessary (that is, according to an instruction given from a control circuit (not shown) included in the read circuit 20).

The offset holding circuit 23 has a function of holding a value of the electrical signal (the offset electrical signal $S_{OFFSET}$) received from the current sensing circuit 21 via the sensing signal selector 22, and outputting an electrical signal having the held value, as necessary, even when electrical signals are no longer received.

The offset canceling circuit 24 has a function of generating an electrical signal (a judging signal) $S_{NET}$ that corresponds to a difference between the two input electrical signals (that is, between the memory cell electrical signal $S_{CELL}$ received from the current sensing circuit 21 via the sensing signal selector 22 while the memory cell 4 is selected, and the offset electrical signal $S_{OFFSET}$ held in the offset holding circuit 23).

The data judging circuit 25 has a function of outputting an electrical signal $S_{OUT}$ that corresponds to "1" or "0" as memory data stored in the read-target memory cell, based on the electrical signal (the judging signal) $S_{NET}$ output from the offset canceling circuit 24.

[Example Using ReRAM]

Figure 4:
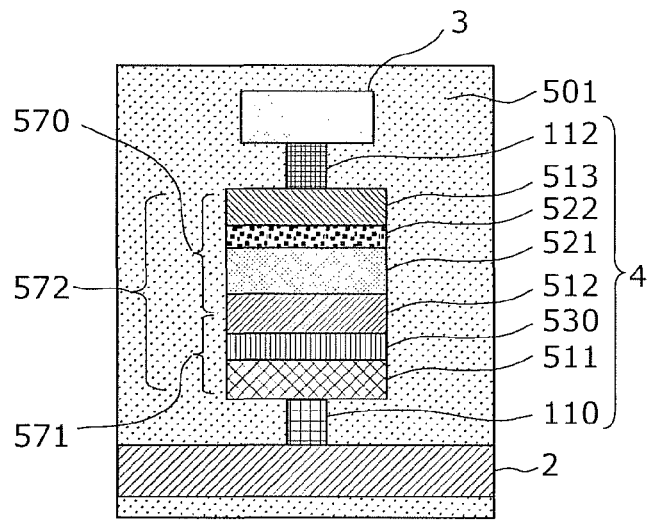
[FIG. 4]

FIG. 4 shows, as an example, a structure of the memory cell 4 which uses a variable resistance element (ReRAM) as a variable resistance memory element of the memory element 111 and an MSM diode as a switching element.

As shown in FIG. 4, a variable resistance element 570 has a layered structure which includes a second electrode 512, a high oxygen deficiency layer 521, a low oxygen deficiency layer 522, and a third electrode 513. A diode 571 has a layered structure which includes a first electrode 511, a semiconductor layer 530, and the second electrode 512. Although the second electrode 512 is shared by the variable resistance element 570 and the diode 571 in the memory element 572 shown in FIG. 4, the second electrode 512 may have a two or more-layer structure of different materials when the variable resistance element 570 and the diode 571 need to have different electrode materials.

As the material of each of the first electrode 511 and the second electrode 512, tantalum nitride (TaN), titanium nitride (TiN), tungsten (W), or the like can be used, among which a 50 nm-thick TaN layer is used herein.

As the material of the third electrode 513, any one of platinum (Pt), iridium (Ir), and palladium (Pd), or an alloy thereof can be used, among which a 50-nm thick Ir layer is used herein. The material of the third electrode 513 is desirably a material which has a standard electrode potential higher than the standard electrode potential of a metal included in the variable resistance layer.

The high oxygen deficiency layer 521 and the low oxygen deficiency layer 522 form the variable resistance layer of the variable resistance element 570. A change in the resistance of this variable resistance layer causes a change in the resistance of the variable resistance element 570.

In this embodiment, the oxygen deficiency of the low oxygen deficiency layer 522 is lower than the oxygen deficiency of the high oxygen deficiency layer 521. Here, the oxygen deficiency refers to a ratio of deficient oxygen in a transition metal relative to the amount of oxygen included in the oxide having its stoichiometric composition. For example, when the transition metal is tantalum (Ta), the stoichiometric composition of the oxide is $Ta_2O_5$, which can be expressed as $TaO_{2.5}$. The oxygen deficiency of $TaO_{2.5}$ is 0%. Furthermore, for example, the oxygen deficiency of an oxygen-deficient tantalum oxide having a composition $TaO_{1.5}$ is determined by the expression; the oxygen deficiency=(2.5−1.5)/2.5=40%.

For the high oxygen deficiency layer 521, an oxygen-deficient film is used which is made of an oxide of which oxygen content is low in atom ratio as compared to an oxide having a stoichiometric composition; the case using a tantalum oxide is explained herein. The layer is formed as follows. The high oxygen deficiency layer 521 is made of $TaO_x$ (0<x<2.5) as a favorable range and is preferably 30 nm or more and 100 nm or less in thickness.

The low oxygen deficiency layer 522 is made of $TaO_y$ (x<y) as a favorable range and is preferably 1 nm or more and 10 nm or less in thickness. It is possible to adjust the value x of $TaO_x$ in the chemical formula by adjusting the flow rate of oxygen gas relative to the flow rate of argon gas in the sputtering.

To explain according to specific steps in the sputtering, first, a substrate is placed in a sputtering device which is then vacuumed to approximately $7 \times 10^{-4}$ Pa. Subsequently, using tantalum as a target, sputtering is performed with a combination of argon gas and oxygen gas at a total gas pressure of 3.3 Pa and with the substrate at set temperature of 30 degrees Celsius. As the oxygen partial pressure changes from 1% to 7% in the ratio, the oxygen content atomic percentage in the tantalum oxide layer (i.e., the composition ratio of oxygen atoms to the total atoms (O/(Ta+O)) changes from approximately 40% ($TaO_{0.66}$) to approximately 70% ($TaO_{2.3}$). The composition of the tantalum oxide layer can be measured using the Rutherford Backscattering Spectrometry. Furthermore, the oxide having its stoichiometric composition refers herein to $Ta_2O_5$, which is an insulator, in the case of the tantalum oxide. When becoming oxygen-deficient, a metal oxide becomes electrically conductive. In this embodiment, a 6 nm-thick $Ta_2O_5$ film is deposited as the low oxygen deficiency layer 522, and 50 nm-thick $TaO_{0.66}$ is deposited as the high oxygen deficiency layer 521.

Furthermore, as the low oxygen deficiency layer 522 and the high oxygen deficiency layer 521, a variable resistance layer which has the same or like layered structure can be formed using, other than the oxygen-deficient tantalum oxide film, an oxide film which includes iron that is also oxygen-deficient, or other transition metal oxides which include hafnium (Hf), zirconium (Zr), titanium (Ti), niobium (Nb), or tungsten (W). Methods of forming these films include a sputtering method and a chemical vapor deposition (CVD) method. Each of the low oxygen deficiency layer 522 and the high oxygen deficiency layer 521 may be formed of, or include at least, one selected from among the above-listed plurality of oxides. Specifically, it may be that the low oxygen deficiency layer 522 includes at least one of an oxygen-deficient tantalum oxide film, an oxygen-deficient iron oxide film, an oxygen-deficient hafnium oxide film, and an oxygen-deficient zirconium oxide, and the high oxygen deficiency layer 521 includes at least one of an oxygen-deficient tantalum oxide film, an oxygen-deficient iron oxide film, an oxygen-deficient hafnium oxide film, and an oxygen-deficient zirconium oxide.

A transition metal has a plurality of states of oxidation and is therefore allowed to provide different resistance states by oxidation-reduction reactions. For example, in the case using the hafnium oxide, it has been verified that the resistance value of the variable resistance layer can stably change at high speed when x in the composition $HfO_x$ of the high oxygen deficiency layer 521 is 0.9 or more and 1.6 or less and y in the composition $HfO_y$ of the low oxygen deficiency layer 522 is larger than x. In this case, the thickness of the low oxygen deficiency layer 522 is preferably 3 nm or more and 4 nm or less in thickness. Alternatively, in the case using the zirconium oxide, it has been verified that the resistance value of the variable resistance layer can stably change at high speed when x in the composition $ZrO_x$ of the high oxygen deficiency layer 521 is 0.9 or more and 1.4 or less and y in the composition $ZrO_y$ of the low oxygen deficiency layer 522 is larger than x. In this case, the thickness of the low oxygen deficiency layer 522 is preferably 1 nm or more and 5 nm or less. By forming the variable resistance layer as above which has a layered structure: the low oxygen deficiency layer 522 that has high resistance and a small thickness; and the high oxygen deficiency layer 521 that has low resistance, the voltage applied to the variable resistance element is distributed more to the low oxygen deficiency layer 522 that has high resistance, which allows the oxidation-reduction in the low oxygen deficiency layer 522 to be more likely to occur.

Furthermore, a first transition metal included in the high oxygen deficiency layer 521 and a second transition metal included in the low oxygen deficiency layer 522 may include different materials. In this case, the low oxygen deficiency layer 522 preferably has a lower degree of oxygen deficiency, that is, higher resistance, than the high oxygen deficiency layer 521. With such a structure, the voltage applied to the variable resistance layer at the time of a change in resistance is distributed more to the low oxygen deficiency layer 522, which allows the oxidation-reduction reaction in the low oxygen deficiency layer 522 to be more likely to occur. When the first transition metal and the second transition metal include different materials, the standard electrode potential of the second transition metal is preferably smaller than the standard electrode potential of the first transition metal. A resistance change phenomenon presumably occurs by an oxidation-reduction reaction in a tiny filament (a conductive path) formed in the low oxygen deficiency layer 522 having high resistance, which reaction changes the value of resistance. For example, when the high oxygen deficiency layer 521 includes an oxygen-deficient tantalum oxide and the low oxygen deficiency layer 522 includes a titanium oxide ($TiO_2$), stable resistance change operation is achieved. Titanium (with the standard electrode potential=−1.63 eV) is a material having a lower standard electrode potential than tantalum (with the standard electrode potential=−0.6 eV). The standard electrode potential having a larger value represents a property of being more difficult to oxidize. Providing, as the low oxygen deficiency layer 522, an oxide of a metal having a lower standard electrode potential than the standard electrode potential of the high oxygen deficiency layer 521 makes an oxidation-reduction reaction more likely to occur in the low oxygen deficiency layer 522. With the variable resistance layer having the above-described layered structure, the initial resistance value of the variable resistance element right after manufacture is very high.

As a material of the semiconductor layer 530, nitrogen-deficient silicon nitride ($SiN_x$) is used. Such an $SiN_x$ film having a semiconductor property can be formed by reactive sputtering which uses an Si target in a nitrogen gas atmosphere, for example. For example, under a production condition at room temperature, the pressure of the chamber is set to 0.1 Pa to 1 Pa, and the flow rate $Ar/N_2$ is set to 18 sccm/2 sccm.

In the case where 16 nm-thick $SiN_x$ having a semiconductor property was fabricated under the above condition, the application of voltage 1.6 V resulted in current density $2.5 \times 10^3$ A/cm$^2$ while the application of voltage 0.8 V resulted in current density $5 \times 10^2$ A/cm$^2$. Thus, it has been verified that, in the case where the above voltage is used as a reference, the ON/OFF ratio of current is 5, which means that the resultant is sufficiently usable as the diode element in the nonvolatile semiconductor memory device 1000.

As a material of each of the first via 110 and the second via 112, W is used.

Examples of an interlayer insulating film 501 include a TEOS-SiO film, a silicon nitride (SiN) film, a low dielectric constant material, such as a silicon carbonitride (SiCN) film or a silicon oxycarbide (SiOC) film, or a fluorinated silicon oxide (SiOF) film. Furthermore, a layered structure in which these materials are stacked may be used. Herein, the TEOS-SiO film is used.

As the word lines 2 and the bit lines 3, copper (Cu) lines, aluminum-copper alloy (Al—Cu) lines, and the like which are used in typical semiconductors can be used. Herein, the Al—Cu lines are used.

The resistance value of the variable resistance element 570 with the above structure right after manufacture (the initial resistance value) is higher than a resistance value thereof in a high resistance (HR) state at the time of normal resistance change operation. In order for the unoperated element after manufacture (in the state where no memory operation has been performed yet) to be placed in a state where the resistance change operation (the memory operation) is possible, there is a need for initial breakdown (that is operation to apply voltage higher than a voltage which is applied in the normal resistance change operation, to thereby place the element in a state where the memory operation is possible (generally to lower the resistance)).

Since the initial resistance value of the variable resistance element which is used as a memory cell for storing data is very high right after manufacture, the variable resistance element needs to be subjected to the initial breakdown to cause a resistance change; if a certain resistance variable element is not subjected to the initial breakdown intentionally, the memory cell including the resistance variable element can be used as the offset detection cell. Thus, in the case where the variable resistance element 570 of FIG. 4 is used, it is possible to manufacture the memory cell 4 and the offset detection cell 5 by selecting whether to perform the initial breakdown. In other words, it may be that the memory cell 4 is a cell on which the initial breakdown for causing the memory element to perform the memory operation has been performed after manufacture while the offset detection cell 5 is a cell which has the same structure as the memory cell 4 and on which no initial breakdown has been performed after manufacture. Thus, there is an advantage of widening the variety of choices for circuit design because which cell is to be used as the offset detection cell 5 can be selected after manufacture. Furthermore, there is no difference in the manufacturing process between the memory call 4 and the offset detection cell 5, with the result that the influence of a layout difference between the memory cell 4 and the offset detection cell 5 on the size of the finished product can be eliminated.

It is to be noted that the effects obtained in the case where the variable resistance element 570 of FIG. 4 is used are not limited to this embodiment only and are seen in the later-described Embodiments 2 and 3.

[Read Method]

Subsequently, a read method for use in the nonvolatile semiconductor memory device 1000 according to this embodiment is described with reference to FIGS. 5 and 6.

The following cites, as an example, the operation to read data from the read-target cell (the memory cell to be read) 4a and describes a sequence thereof.

Figure 5:
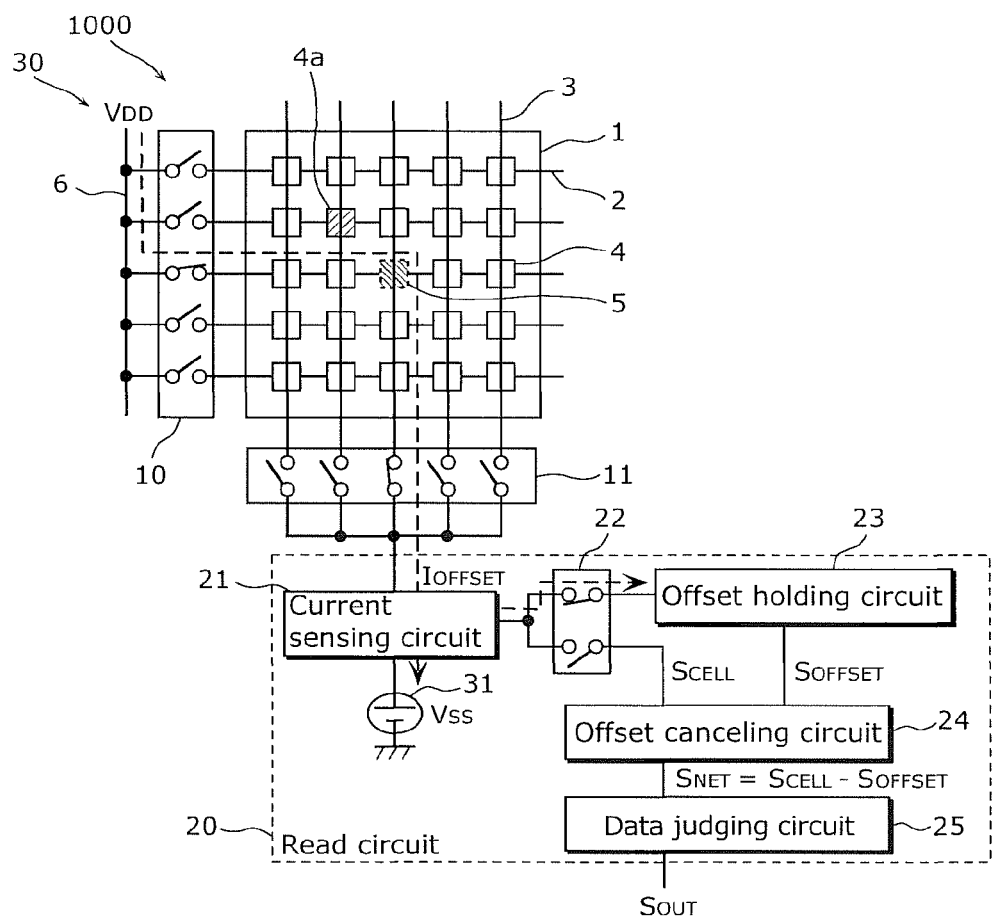
[FIG. 5]

First, as shown in FIG. 5, the word line selector 10 connects, to the power supply line 6, only the word line connected to the offset detection cell 5 while leaving the other word lines in the unconnected state. Subsequently, the bit line selector 11 connects, to the current sensing circuit 21, only the bit line connected to the offset detection cell 5 while leaving the other bit lines in the unconnected state. With this, the current $I_{OFFSET}$ which flows in the bit line selector 11-side end of the bit line selected by the bit line selector 11 (the selected bit line) is input to the current sensing circuit 21, and the electrical signal (the offset electrical signal) $S_{OFFSET}$ that corresponds to a value of the current $I_{OFFSET}$ is output from the current sensing circuit 21. It is sufficient that this electrical signal output from the current sensing circuit 21 is an electrical signal which changes according to a value of the current input to the current sensing circuit 21, and the electrical signal can be freely selected in conformity with a type of a circuit determined to be used as each of the offset holding circuit 23 and the offset canceling circuit 24. For example, the amplitude of current or voltage or the pulse width or pulse density of the pulsed current or voltage may be used.

Subsequently, the sensing signal selector 22 outputs the electrical signal (the offset electrical signal) $S_{OFFSET}$ to the offset holding circuit 23 and causes the offset holding circuit 23 to hold the offset electrical signal $S_{OFFSET}$. At this time, the current sensing circuit 21 is disconnected from the offset canceling circuit 24 by the sensing signal selector 22 as shown in FIG. 5.

Figure 6:
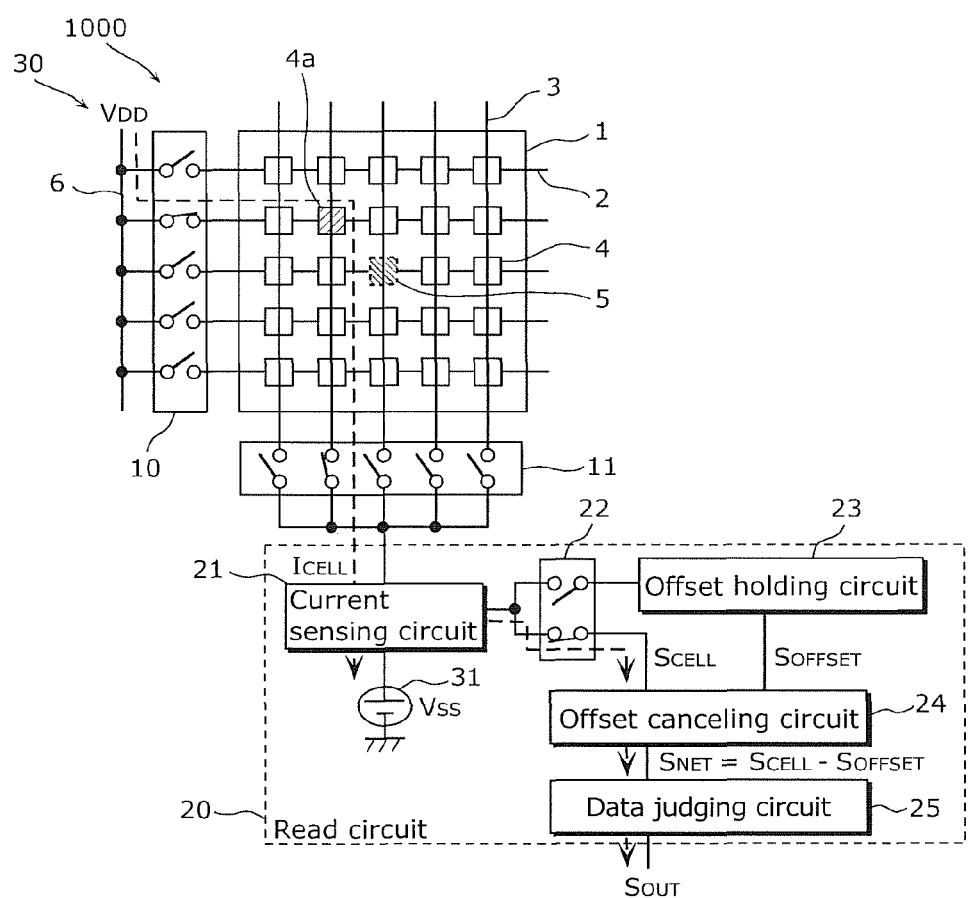
[FIG. 6]

Next, as shown in FIG. 6, the word line selector 10 connects, to the power supply line 6, only the word line which includes the read-target cell 4a while leaving the other word lines in the unconnected state. Subsequently, the bit line selector 11 connects, to the current sensing circuit 21, only the bit line which includes the read-target cell 4a while leaving the other bit lines in the unconnected state. With this, current $I_{CELL}$ which flows in the bit line selector 11-side end of the bit line selected by the bit line selector 11 is input to the current sensing circuit 21, and an electrical signal (a memory cell electrical signal) $S_{CELL}$ that corresponds to a value of the current $I_{CELL}$ is output from the current sensing circuit 21.

Subsequently, the sensing signal selector 22 inputs the electrical signal (the memory cell electrical signal) $S_{CELL}$ to the offset canceling circuit 24. At this time, the current sensing circuit 21 is disconnected from the offset holding circuit 23 by the sensing signal selector 22 as shown in FIG. 6. Almost at the same time, the offset holding circuit 23 is caused to output the held electrical signal (the offset electrical signal) $S_{OFFSET}$ to the offset canceling circuit 24.

The offset canceling circuit 24 outputs an electrical signal (a judging signal) $S_{NET}$ ($=S_{CELL}-S_{OFFSET}$) which corresponds to a difference between the two input electrical signals. This electrical signal (the judging signal) $S_{NET}$ is input to the data judging circuit 25.

The data judging circuit 25 judges, based on a value of the input electrical signal (judging signal) $S_{NET}$, whether the memory element included in the read-target cell 4a is in the high resistance (HR) state or in the low resistance (LR) state (i.e., the data stored in the read-target cell 4a), and outputs, as an output signal of the read circuit 20, an electrical signal $S_{OUT}$ that corresponds to "1" or "0" to outside.

The significance of the read method is as follows.

The current $I_{CELL}$ input to the current sensing circuit 21 when the word line selector 10 and the bit line selector 11 select the word line and the bit line, respectively, which include the read-target cell 4a is a sum ($I_{CELL}=I_0+I_{SNEAK}$) of a current component $I_0$ which flows across the read-target cell 4a and the sneak current component $I_{SNEAK}$ which flows through, except the read-target cell 4a, the memory cells 4 and the offset detection cell 5 which are included in the cross-point cell array 1.

The current component $I_0$ which flows across the read-target cell 4a changes depending on the data stored in the memory element included in the read-target cell 4a, that is, whether the memory element is in the high resistance (HR) state or in the low resistance (LR) state, and has a larger value when the memory element is in the LR state.

The sneak current component $I_{SNEAK}$ is hardly influenced by the data stored in the memory element included in the read-target cell 4a, but changes depending on the data stored in all the memory cells 4 except the read-target cell 4a in the cross-point cell array 1, and the value of the sneak current component $I_{SNEAK}$ is the largest when the memory elements in all the memory cells 4 except the read-target cell 4a are in the LR state while it is the smallest when the memory elements in all the memory cells 4 except the read-target cell 4a are in the HR state. Furthermore, an increase in the size of the cross-point cell array 1 accompanies an increase in the sneak current component $I_{SNEAK}$.

Accordingly, the current $I_{CELL}$ has a low signal-to-noise ratio and is largely influenced by the sneak current component $I_{SNEAK}$. Here, the signal-to-noise ratio of the current $I_{CELL}$ is defined as follows.

Signal-to-Noise ratio=$(I_{LR}-I_{HR})/(I_{HR}+I_{SNEAK})$ $I_{LR}$: $I_{CELL}$ when the memory element in the read-target cell 4a is in the LR state $I_{HR}$: $I_{CELL}$ when the memory element in the read-target cell 4a is in the HR state As described above, the sneak current component $I_{SNEAK}$ not only changes depending on the size of the cross-point cell array 1, but also dynamically changes depending on the data stored in the cross-point cell array 1. Thus, the signal-to-noise ratio is determined with the sneak current component $I_{SNEAK}$ having the largest value. By providing the memory element with a series-connected structure of the variable resistance memory element and the switching element, it is possible to reduce the sneak current component $I_{SNEAK}$ as compared to the case where the memory element is composed of the variable resistance memory element only, but it is not possible to reduce the increase in the sneak current component $I_{SNEAK}$ which is due to a size increase of the cross-point cell array. Generally, considering property variations of the elements (such as a transistor, a variable resistance memory element, and a switching element) included in a practical nonvolatile semiconductor memory device as well as the influence of signal noise and other factors, when the current $I_{CELL}$ is used as the judging signal, the size of the cross-point cell array is determined so that the maximum value of the sneak current component $I_{SNEAK}$ becomes smaller than or equal to $I_{LR}$.

Meanwhile, the current (the offset current) $I_{OFFSET}$ that is input to the current sensing circuit 21 when the word line selector 10 and the bit line selector 11 select the word line and the bit line, respectively, which include the offset detection cell 5 is ($I_1+I_{SNEAK}$). Here, $I_1$ represents a current component which flows across the offset detection cell 5 and satisfies $I_1<I_{HR}$. Particularly, in the case where the offset detection cell has one of the structures shown in FIGS. 2 and 3, $I_1 \approx 0$ is satisfied, which leads to $I_{OFFSET} \approx I_{SNEAK}$, meaning that the offset current $I_{OFFSET}$ includes the sneak current component $I_{SNEAK}$ only. This sneak current component $I_{SNEAK}$ detected using the offset current $I_{OFFSET}$ does not exactly match the sneak current component $I_{SNEAK}$ included in the current $I_{CELL}$, but its difference decreases as the size of the cross-point cell array 1 increases. In other words, the offset current $I_{OFFSET}$ approximately equals the offset current component that is included in the read-target cell 4a in the cross-point cell array 1 and dynamically changes. Furthermore, as long as $I_1$ included in the offset current $I_{OFFSET}$ satisfies $I_1<I_{HR}$, the effects of the present invention can be obtained, but the offset detection cell desirably has one of the structures shown in FIGS. 2 and 3 because the effects increase as $I_1$ decreases.

The judging signal $S_{NET}$ for judging data according to this embodiment results from removing, from the memory cell electrical signal $S_{CELL}$, a component of the offset electrical signal $S_{OFFSET}$ corresponding to the offset component which changes dynamically, with the result that a significant improvement can be seen in the signal-to-noise ratio, and the accuracy for reading in the nonvolatile semiconductor memory device 1000 is higher, as compared to the case where the memory cell electrical signal $S_{CELL}$ is used directly as a judging signal.

[Flowchart]

Figure 7:
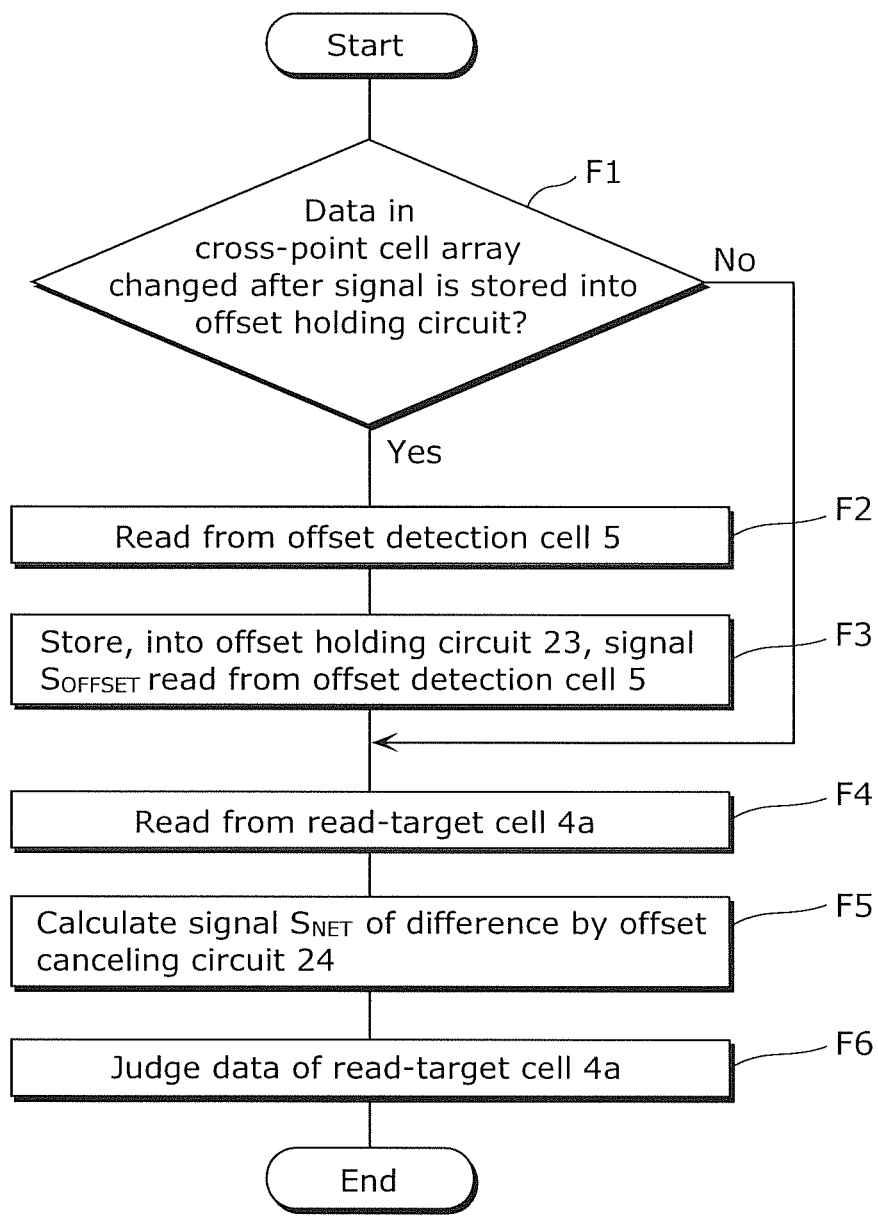
[FIG. 7]

FIG. 7 is a flowchart showing a flow for reading in the nonvolatile semiconductor memory device 1000 according to Embodiment 1 of the present invention.

As mentioned above, in order to read data from the read-target cell 4a, it is necessary to select the offset detection cell 5 and detect the offset electrical signal $S_{OFFSET}$ in advance. This offset electrical signal $S_{OFFSET}$ changes dynamically depending on the data stored in the cross-point cell array 1; conversely, unless the data stored in the cross-point cell array 1 changes, the offset electrical signal $S_{OFFSET}$ held in the offset holding circuit 23 can continue to be used also in reading next data. In this case, the operation to select the offset detection cell 5 and detect the offset electrical signal $S_{OFFSET}$ can be omitted.

First, upon request for the reading operation for the memory cell (the read-target cell) 4a, it is determined whether there is any change in data stored in the memory cells included in the cross-point cell 1 array after the signal is stored into the offset holding circuit 23 (F1; a determination process). When it is determined that there is a change in the data (Yes in F1), the offset detection cell 5 is selected to detect the offset electrical signal $S_{OFFSET}$ (F2; the first half of an offset detecting process), and the detected signal is stored into the offset holding circuit 23 (F3; the latter half of the offset detecting process).

After Step F1 is completed when it is determined in Step F1 that there is no change in the data (No in F1) or after Step F3 is completed when it is determined that there is a change in the data (Yes in F1), the read-target cell 4a is selected to read the memory cell electrical signal $S_{CELL}$ (F4; a memory cell detecting process), and by the offset canceling circuit 24, the difference signal (the judging signal) $S_{NET}$ between the read memory cell electrical signal $S_{CELL}$ and the offset electrical signal $S_{OFFSET}$ is calculated (F5; an offset canceling process).

Subsequently, by the data judging circuit 25, the data stored in the read-target cell 4a is judged using the difference signal (the judging signal) $S_{NET}$ (F6; a data judging process). With that, the operation to read data is completed.

The use of the above flow allows, in consecutive reading operations which do not involve data changes (i.e., writing into the memory cell), omission of an operation of selecting the offset detection cell 5 and detecting the offset electrical signal $S_{OFFSET}$ except in the initial cycle, which is therefore effective in improving the speed for reading.

Although the above describes a read method which is performed when the cross-point cell array 1 includes the single offset detection cell 5, the present invention is not limited to the case where the number of offset detection cells 5 is one. When the size of the cross-point cell array 1 is so large that the influence, on the sneak current, of a potential distribution in the word lines 2 and the bit lines 3 which results from a voltage drop caused by line resistance in the word lines 2 and the bit lines 3 is not negligible, the cross-point cell array 1 may further be divided into some sub regions in each of which the offset detection cell 5 is provided so that the offset electrical signal $S_{OFFSET}$ for each sub region is detected and then used to generate a judging signal.

(Embodiment 2)
[Device Structure]

Figure 8:
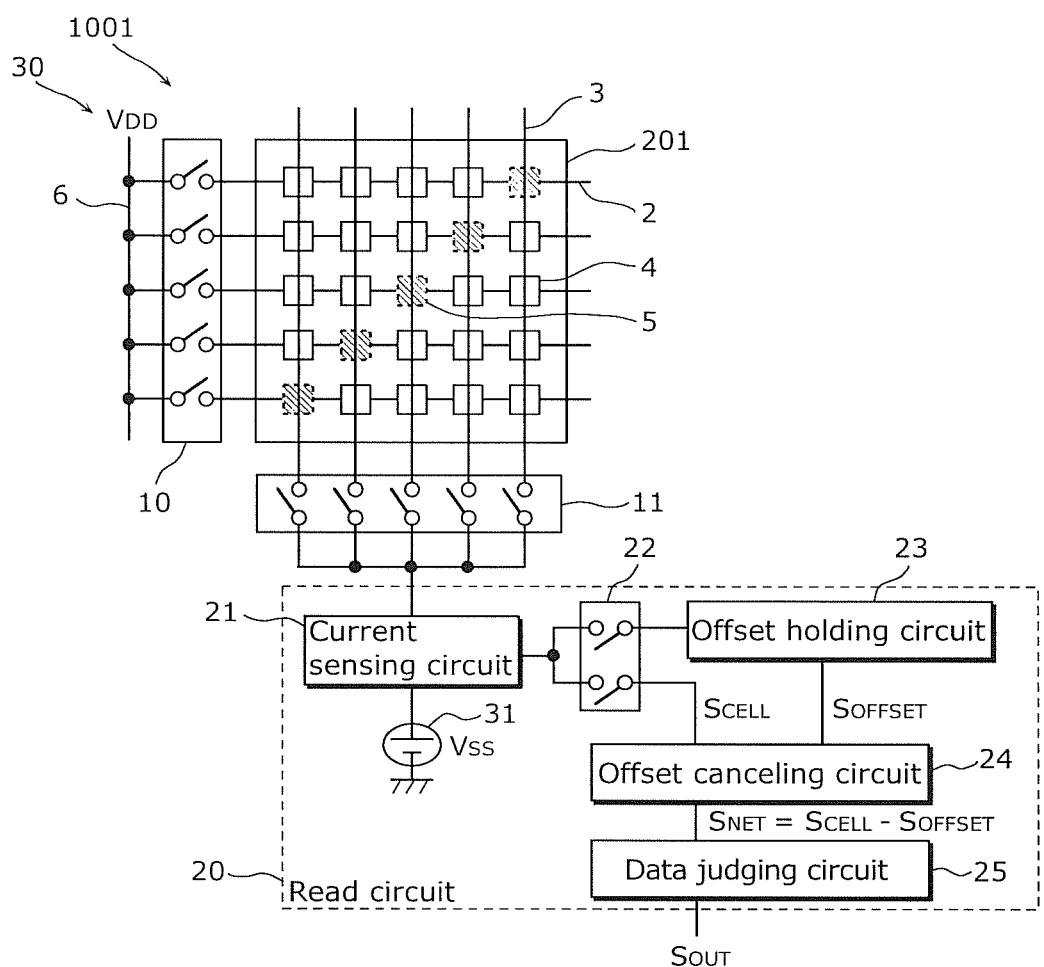
[FIG. 8] FIG. 8 schematically shows a structure of a nonvolatile semiconductor memory device according to Embodiment 2 of the present invention.

FIG. 8 shows, as an example, a structure of a nonvolatile semiconductor memory device 1001 according to Embodiment 2 of the present invention.

A difference between the nonvolatile semiconductor memory device 1001 according to this embodiment and the nonvolatile semiconductor memory device 1000 according to Embodiment 1 is that a plurality of offset detection cells 5 are provided within a cross-point cell array 201 in a manner that one offset detection cell 5 is connected to each of the word lines 2 and each of the bit lines 3. To put it another way, in this embodiment, the offset detection cells 5 are arranged in the cross-point cell array 201 so that they correspond one-to-one with the word lines 2 and one-to-one with the bit lines 3.

Each of the memory cell 4 and the offset detection cell 5 may have the same structure as that described in Embodiment 1.

By providing the offset detection cells 5 as above, the offset current component included in the detecting current for the read-target cell can be detected as the current detected by the offset detection cell 5 connected to the bit line 3 or the word line 2 which includes the target memory cell 4. This produces an effect of further accurate detecting of the offset current component in the read-target memory cell as compared to the case described in Embodiment 1.

The nonvolatile semiconductor memory device 1001 according to Embodiment 2 of the present invention includes, as shown in FIG. 8: the word lines 2 formed in parallel; the bit lines 3 formed in parallel in the direction in which the bit lines 3 cross the word lines 2; and the cross-point cell array 201 formed at the cross-points, in a planar view, of the word lines 2 and the bit lines 3 and between the word lines 2 and the bit lines 3. Furthermore, the cross-point cell array 201 includes the plurality of memory cells 4 and the plurality of offset detection cells 5. Moreover, the offset detection cells 5 are arranged within the cross-point cell array 201 in a manner that one offset detection cell 5 is connected to each of the word lines 2 and each of the bit lines 3. Although the offset detection cells 5 in the cross-point cell array 201 of FIG. 8 are regularly arranged on, as the cross-points of the word lines 2 and the bit lines 3, a diagonal of the cross-point cell array 201 herein, the arrangement is not limited thereto, and as long as one offset detection cell is connected to each of the word lines 2 and each of the bit lines 3, the arrangement of the offset detection cells is not limited to the arrangement on the diagonal of the cross-point cell array 201.

The word line selector 10, the bit line selector 11, the power supply line 6, and the read circuit 20 included in the nonvolatile semiconductor memory device 1001 according to Embodiment 2 of the present invention may be the same as those described in Embodiment 1.

[Read Method]

A read method for use in the nonvolatile semiconductor memory device 1001 according to Embodiment 2 of the present invention is almost the same as the read method for use in the nonvolatile semiconductor memory device 1000 according to Embodiment 1 of the present invention, and only the differences between Embodiment 2 and Embodiment 1 in the present invention are therefore described below.

A difference in the read method between the nonvolatile semiconductor memory devices according to Embodiment 2 and Embodiment 1 is that the word line and the bit line which the word line selector 10 and the bit line selector 11 select, respectively, upon detecting of the offset electrical signal $S_{OFFSET}$ are different.

In the nonvolatile semiconductor memory device 1000 according to Embodiment 1 of the present invention, irrespective of the position of the read-target cell within the cross-point cell array, the same word line and the same bit line are always selected upon detecting of the offset electrical signal $S_{OFFSET}$. In contrast, in the nonvolatile semiconductor memory device 1001 according to Embodiment 2 of the present invention, the word line which includes the read-target cell is selected upon detecting of the offset electrical signal $S_{OFFSET}$. Furthermore, the bit line which is connected to the offset detection cell connected to the selected word line is selected. It is to be noted that the same effects can be obtained even when the bit line which includes the read-target cell is selected and then the word line which is connected to the offset detection cell connected to the selected bit line is selected.

In other words, in this embodiment, the read circuit 20 reads data from the memory cell in one of the following methods.

Specifically, a first read method is a read method in which the memory cell 4 and the offset detection cell 5 shares the word line. In this method, the read circuit 20 judges the memory data stored in the read-target memory cell, based on the judging signal $S_{NET}$ which corresponds to a value obtained by subtracting a value of the offset electrical signal $S_{OFFSET}$ from a value of the memory cell electrical signal $S_{CELL}$. The offset electrical signal $S_{OFFSET}$ corresponds to a value of the current flowing through the second selected bit line when the read voltage is applied between the first selected word line corresponding to the read-target memory cell and the second selected bit line corresponding to the offset detection cell provided for the first selected word line.

A second read method is a read method in which the memory cell and the offset detection cell share the bit line. In this method, the read circuit 20 judges the memory data stored in the read-target memory cell, based on the judging signal $S_{NET}$ which corresponds to a value obtained by subtracting a value of the offset electrical signal $S_{OFFSET}$ from a value of the memory cell electrical signal $S_{CELL}$. The offset electrical signal $S_{OFFSET}$ corresponds to a value of the current flowing through the first selected bit line when the read voltage is applied between the second selected word line corresponding to the offset detection cell provided for the first selected bit line corresponding to the read-target memory cell and the first selected bit line corresponding to the read-target memory cell.

The sneak current component $I_{SNEAK}$ included in the current $I_{CELL}$ detected when the read-target cell is selected changes depending on the data stored in the memory cell 4 included in the cross-point cell array 201 and is influenced more by the data stored in the memory cell 4 connected to the bit line 3 and the word line 2 which are connected to the read-target cell than by the data stored in the memory cell 4 connected to neither of the bit line 3 and the word line 2 which are connected to the read-target cell.

In the nonvolatile semiconductor memory device 1001 according to Embodiment 2 of the present invention, since the read-target cell and the offset detection cell 5 share one of the word line 2 and the bit line 3, the offset current $I_{OFFSET}$ detected by the offset detection cell 5 has a value close to the sneak current component $I_{SNEAK}$ included in the current $I_{CELL}$ detected when the read-target cell is selected, with the result that, as compared to Embodiment 1, improvements can be seen in the signal-to-noise ratio and in the accuracy for reading in the nonvolatile semiconductor memory device 1001.
(Variation of Embodiment 2)
[Device Structure]

Figure 9:
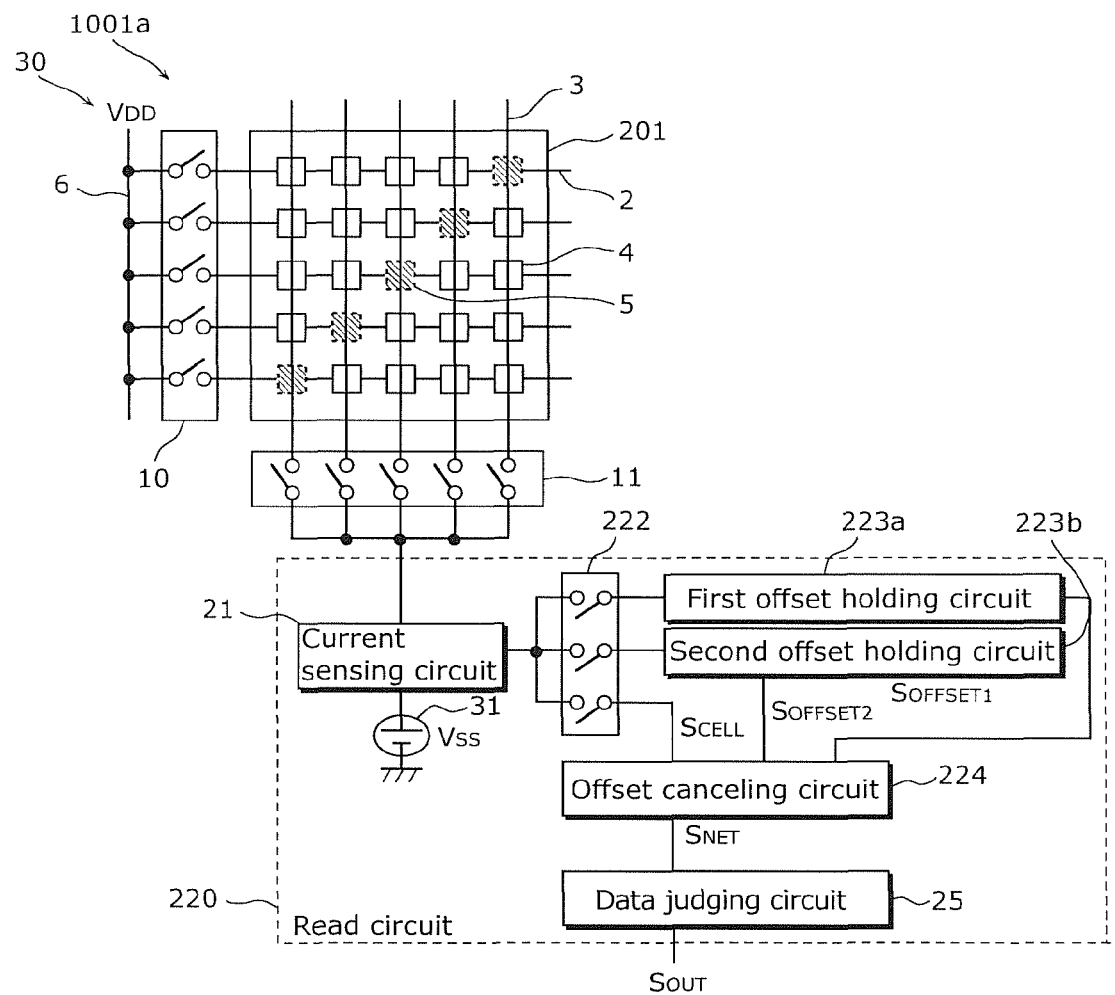
[FIG. 9] FIG. 9 schematically shows a structure of a nonvolatile semiconductor memory device according to Variation of Embodiment 2 of the present invention.

FIG. 9 shows, as an example, a structure of a nonvolatile semiconductor memory device 1001a according to Variation of Embodiment 2 of the present invention.

A difference between the nonvolatile semiconductor memory device 1001a according to this variation and the nonvolatile semiconductor memory device 1001 according to Embodiment 2 is that the offset current component included in the detecting current for the read-target cell is detected with reference to two currents: a current detected by the offset detection cell connected to the word line which includes the target memory cell; and a current detected by the offset detection cell connected to the bit line which includes the target memory cell. This produces an effect of further accurate detecting of the offset current component in the read-target memory cell as compared to the case described in Embodiment 2.

It is possible to use the cross-point cell array 201, the word line selector 10, the bit line selector 11, and the power supply line 6 which are the same as those in the nonvolatile semiconductor memory device 1001 according to Embodiment 2.

The nonvolatile semiconductor memory device 1001a of FIG. 9 further includes a read circuit 220. The read circuit 220 is a circuit which reads data stored in the read-target memory cell selected by the word line selector 10 and the bit line selector 11 from the cross-point cell array 201, and includes the current sensing circuit 21, a sensing signal selector 222, a first offset holding circuit 223a, a second offset holding circuit 223b, an offset canceling circuit 224, and the data judging circuit 25.

Furthermore, to the current sensing circuit 21, potential VSS is given from the power supply 31. Thus, a potential difference (VDD−VSS) causes a current to flow through the word line 2 and the bit line 3. The current flowing in the bit line selector 11-side end of the bit line selected by the bit line selector 11 is input to the current sensing circuit 21 through the bit line selector 11. The current sensing circuit 21 outputs an electrical signal that corresponds to a value of the input current, that is, an electrical signal that corresponds to a value of the current flowing through the selected bit line.

The sensing signal selector 222 has a function of selecting one of the first offset holding circuit 223a, the second offset holding circuit 223b, and the offset canceling circuit 224 to which the electrical signal output from the current sensing circuit 21 is to be transmitted (that is, selecting where to output the electrical signal), as necessary (that is, according to an instruction given from a control circuit (not shown) included in the read circuit 220).

The first offset holding circuit 223a and the second offset holding circuit 223b have a function of holding values of the electrical signals (a first offset electrical signal $S_{OFFSET1}$ and a second offset electrical signal $S_{OFFSET2}$) received from the current sensing circuit 21 through the sensing signal selector 222, and outputting electrical signals having the held values, as necessary, even when electrical signals are no longer received.

The offset canceling circuit 224 has a function of generating the electrical signal (the judging signal) $S_{NET}$ based on the expression below by referring to the three input electrical signals: the first offset electrical signal $S_{OFFSET1}$ held in the first offset holding circuit 223a; the second offset electrical signal $S_{OFFSET2}$ held in the second offset holding circuit 223b; and the memory cell electrical signal $S_{CELL}$ received from the current sensing circuit 21 via the sensing signal selector 222 while the memory cell 4 is selected.

Suppose that the first offset electrical signal is represented by $S_{OFFSET1}$, the second offset electrical signal is represented by $S_{OFFSET2}$, and the memory cell electrical signal is represented by $S_{CELL}$, the judging signal $S_{NET}$ determined by $$S_{NET}=S_{CELL}-(S_{OFFSET1}+S_{OFFSET2})/2$$

is desirable because this leads to an improvement of the average signal-to-noise ratio. By taking into consideration the signal-to-noise ratio in the case where the distribution of data ("1" or "0") written in the cross-point cell array 201 is biased (for example, when "0" is localized in data a large part of which is "1"), $S_{NET}$ determined by one of the following expressions may be used.

$$S_{NET}=S_{CELL}-\text{MAX}(S_{OFFSET1},S_{OFFSET2})$$

This means that the larger one of $S_{OFFSET1}$ and $S_{OFFSET2}$ is subtracted from $S_{CELL}$.

$$S_{NET}=S_{CELL}-\text{MIN}(S_{OFFSET1},S_{OFFSET2})$$

This means that the smaller one of $S_{OFFSET1}$ and $S_{OFFSET2}$ is subtracted from $S_{CELL}$.

Alternatively, the value obtained by subtracting the weighted mean of $S_{OFFSET1}$ and $S_{OFFSET2}$ from $S_{CELL}$ as in the expression below may be used as $S_{NET}$.

$$S_{NET}=S_{CELL}-(\alpha \times S_{OFFSET1}+\beta \times S_{OFFSET2})/(\alpha+\beta)$$

Here, α is a given constant which represents a weight for $S_{OFFSET1}$ to obtain the weighted mean, and β is a given constant which represents a weight for $S_{OFFSET2}$ to obtain the weighted mean.

The data judging circuit 25 has a function of outputting an electrical signal $S_{OUT}$ that corresponds to "1" or "0" as memory data stored in the read-target memory cell, based on the electrical signal (the judging signal) $S_{NET}$ output from the offset canceling circuit 224.
[Read Method]

Subsequently, a read method for use in the nonvolatile semiconductor memory device 1001a according to this variation is described with reference to FIGS. 10 to 12.

The following cites, as an example, the operation to read data from the read-target cell (the memory cell to be read) 4a and describes a sequence thereof.

Figure 10:
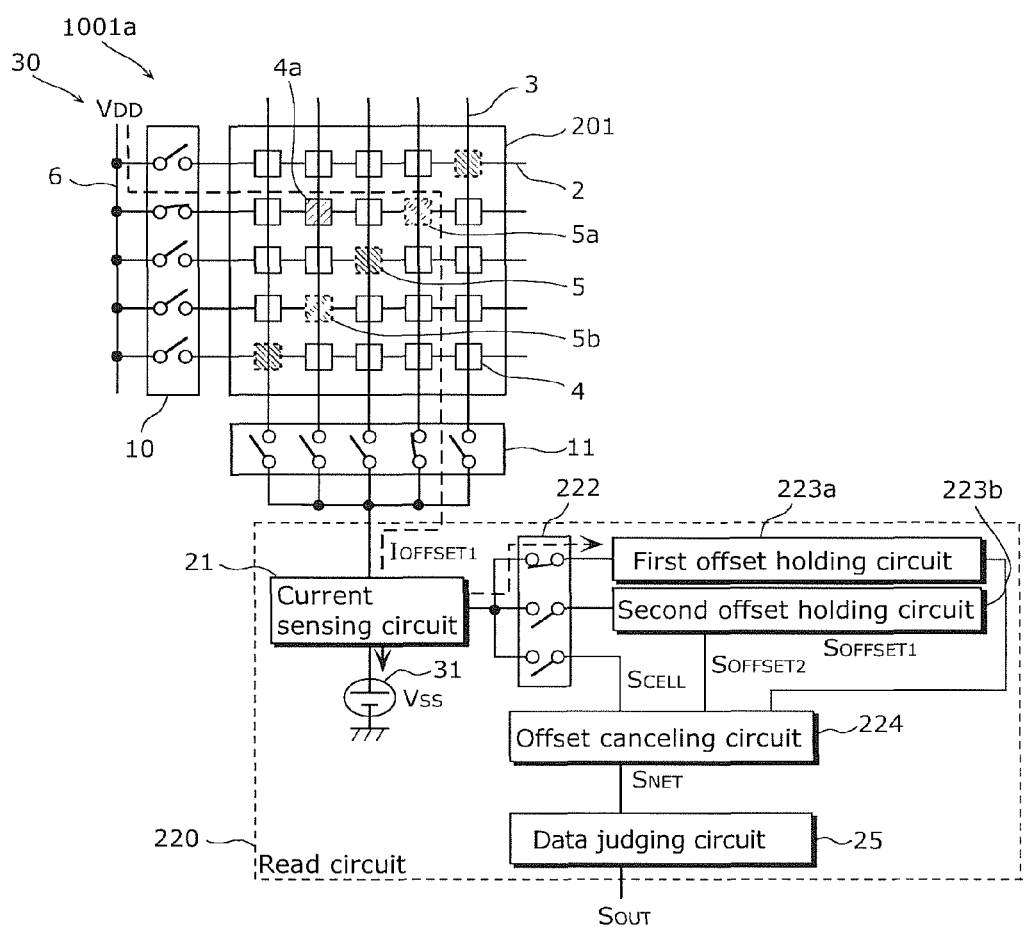
[FIG. 10]

First, as shown in FIG. 10, the word line selector 10 connects, to the power supply line 6, only the word line connected to the read-target cell 4a while leaving the other word lines in the unconnected state. Subsequently, the bit line selector 11 connects, to the current sensing circuit 21, only the bit line connected to a word-line offset detection cell 5a (the offset detection cell which is connected to the word line connected to the read-target cell 4a) while leaving the other bit lines in the unconnected state. With this, current $I_{OFFSET1}$ which flows in the bit line selector 11-side end of the bit line selected by the bit line selector 11 (the selected bit line) is input to the current sensing circuit 21, and the electrical signal (the first offset electrical signal) $S_{OFFSET1}$ that corresponds to a value of the current $I_{OFFSET1}$ is output from the current sensing circuit 21. It is sufficient that this electrical signal output from the current sensing circuit 21 is an electrical signal which changes according to a value of the current input to the current sensing circuit 21, and the electrical signal can be freely selected in conformity with a type of a circuit determined to be used as each of the first offset holding circuit 223a, the second offset holding circuit 223b, and the offset canceling circuit 224. For example, the amplitude of current or voltage or the pulse width or pulse density of the pulsed current or voltage may be used.

Subsequently, the sensing signal selector 222 outputs the electrical signal $S_{OFFSET1}$ to the first offset holding circuit 223a and causes the first offset holding circuit 223a to hold the electrical signal $S_{OFFSET1}$. At this time, the current sensing circuit 21 is disconnected from the second offset holding circuit 223b and the offset canceling circuit 224 by the sensing signal selector 222 as shown in FIG. 10.

Figure 11:
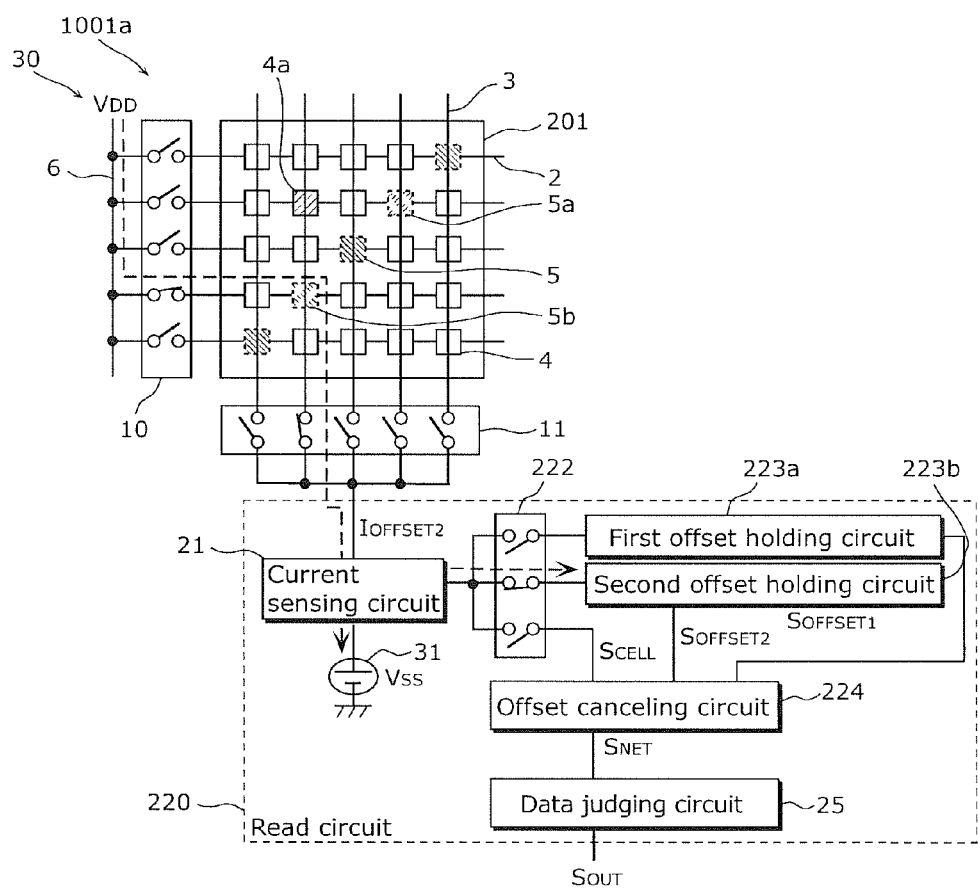
[FIG. 11]

Subsequently, as shown in FIG. 11, the word line selector 10 connects, to the power supply line 6, only the word line which is connected to a bit-line offset detection cell 5b (the offset detection cell which is connected to the bit line connected to the read-target cell 4a) while leaving the other word lines in the unconnected state. Subsequently, the bit line selector 11 connects, to the current sensing circuit 21, only the bit line connected to the bit-line offset detection cell 5b while leaving the other bit lines in the unconnected state. With this, current $I_{OFFSET2}$ which flows in the bit line selector 11-side end of the bit line selected by the bit line selector 11 (the selected bit line) is input to the current sensing circuit 21, and the electrical signal (the second offset electrical signal) $S_{OFFSET2}$ that corresponds to a value of the current $I_{OFFSET2}$ is output from the current sensing circuit 21. Subsequently, the sensing signal selector 222 outputs the electrical signal $S_{OFFSET2}$ to the second offset holding circuit 223b and causes the second offset holding circuit 223b to hold the electrical signal $S_{OFFSET2}$. At this time, the current sensing circuit 21 is disconnected from the first offset holding circuit 223a and the offset canceling circuit 224 by the sensing signal selector 222 as shown in FIG. 11.

Figure 12:
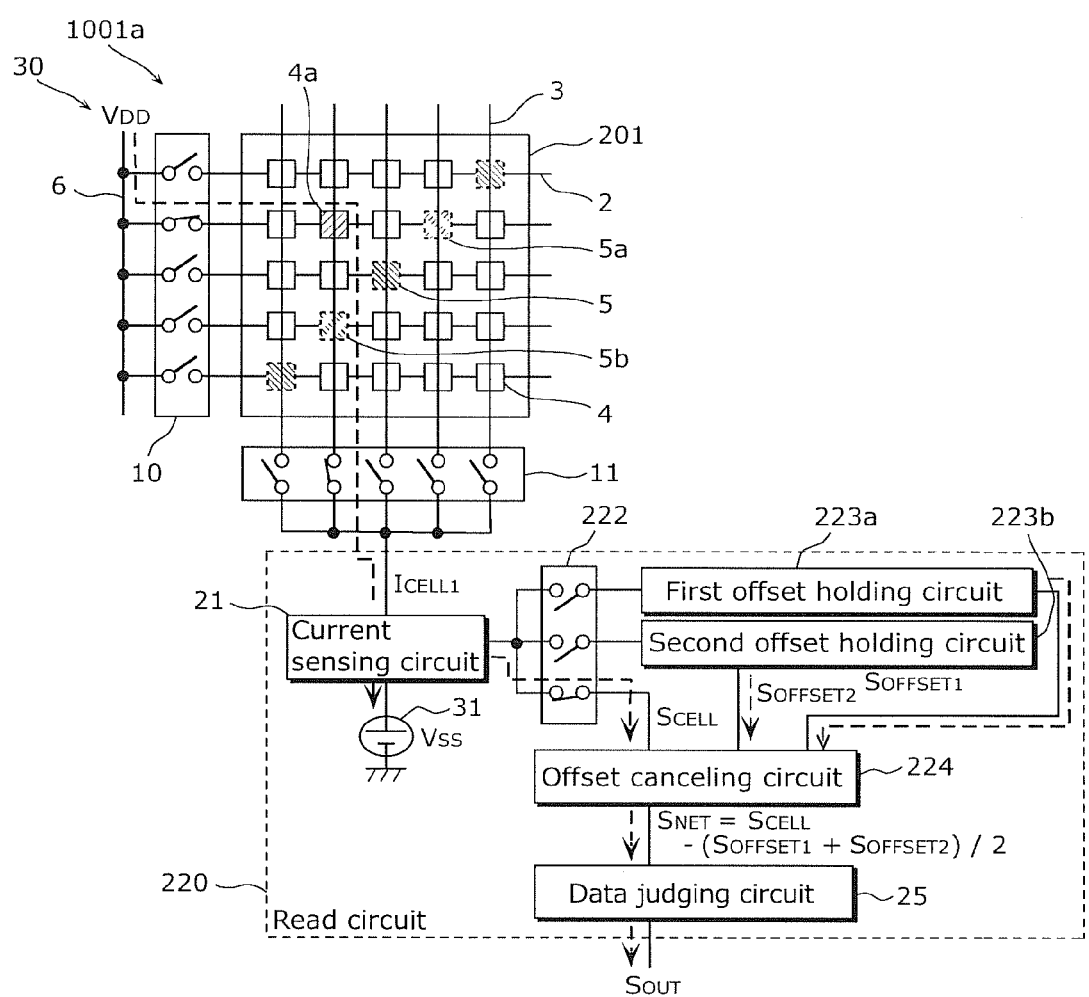
[FIG. 12]

First, as shown in FIG. 12, the word line selector 10 connects, to the power supply line 6, only the word line connected to the read-target cell 4a while leaving the other word lines in the unconnected state. Subsequently, the bit line selector 11 connects, to the current sensing circuit 21, only the bit line connected to the read-target cell 4a while leaving the other bit lines in the unconnected state. With this, the current $I_{CELL}$ which flows in the bit line selector 11-side end of the bit line selected by the bit line selector 11 is input to the current sensing circuit 21, and the electrical signal (the memory cell electrical signal) $S_{CELL}$ that corresponds to a value of the current $I_{CELL}$ is output from the current sensing circuit 21.

Subsequently, the sensing signal selector 222 inputs the electrical signal (the memory cell electrical signal) $S_{CELL}$ to the offset canceling circuit 224. At this time, the current sensing circuit 21 is disconnected from the first offset holding circuit 223a and the second offset holding circuit 223b by the sensing signal selector 222 as shown in FIG. 12. Almost at the same time, the electrical signal (the first offset electrical signal) $S_{OFFSET1}$ held in the first offset holding circuit 223a and the electrical signal (the second offset electrical signal) $S_{OFFSET2}$ held in the second offset holding circuit 223b are output from the respective circuits and then are input to the offset canceling circuit 224.

The offset canceling circuit 224 outputs an electrical signal (a judging signal) $S_{NET}$ ($=S_{CELL}-(S_{OFFSET1}+S_{OFFSET2})/2$) which corresponds to a value obtained by subtracting, from the electrical signal (the memory cell electrical signal) $S_{CELL}$, the mean of the electrical signal (the first offset electrical signal) $S_{OFFSET1}$ and the electrical signal (the second offset electrical signal) $S_{OFFSET2}$. This electrical signal is input to the data judging circuit 25.

The data judging circuit 25 judges, based on a value of the input electrical signal (judging signal) $S_{NET}$, whether the resistance state of the variable resistance memory element included in the read-target cell 4a is the high resistance (HR) state or the low resistance (LR) state (i.e., the data stored in the read-target cell 4a), and outputs, as an output signal of the read circuit 220, an electrical signal $S_{OUT}$ that corresponds to "1" or "0" to outside.

[Flowchart]

Figure 13:
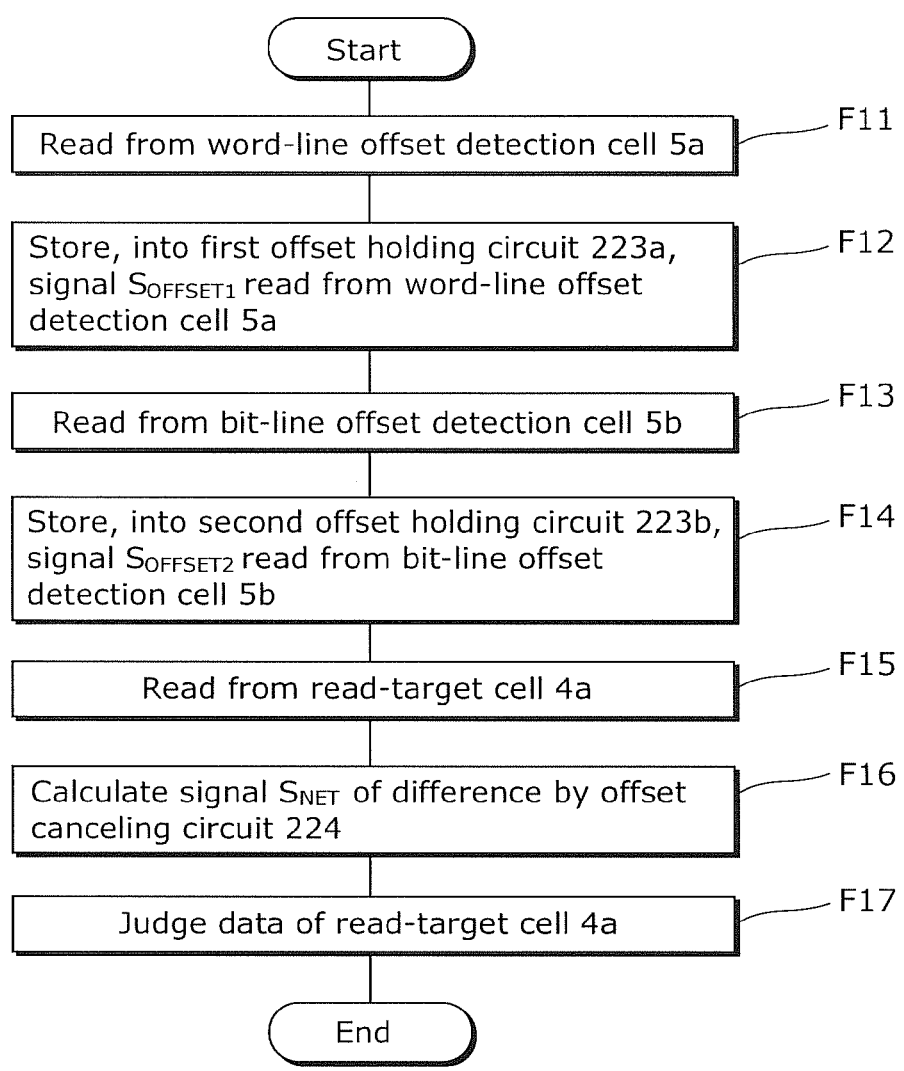
[FIG. 13]

FIG. 13 is a flowchart showing a flow for reading in the nonvolatile semiconductor memory device 1001a of FIG. 10.

Upon request for the reading operation for the memory cell (the read-target cell) 4a, first, the word-line offset detection cell 5a is selected to detect the first offset electrical signal $S_{OFFSET1}$ (F11; the first half of a first offset detecting process), and the detected signal is stored into the first offset holding circuit 223a (F12; the latter half of the first offset detecting process).

Subsequently, the bit-line offset detection cell 5b is selected to detect the second offset electrical signal $S_{OFFSET2}$ (F13; the first half of a second offset detecting process), and the detected signal is stored into the second offset holding circuit 223b (F14; the latter half of the second offset detecting process).

Subsequently, the read-target cell 4a is selected to read a signal (F15; a memory cell detecting process), and by the offset canceling circuit 224, the difference signal (the judging signal) $S_{NET}$ is calculated by subtracting, from the read signal, the mean of the first offset electrical signal $S_{OFFSET1}$ and the second offset electrical signal $S_{OFFSET2}$ (F16; an offset canceling process).

Subsequently, by the data judging circuit 25, the data stored in the read-target cell 4a is judged using the difference signal $S_{NET}$ (F17; a data judging process). With that, the operation to read data is completed.

(Embodiment 3)
[Device Structure]

Figure 14:
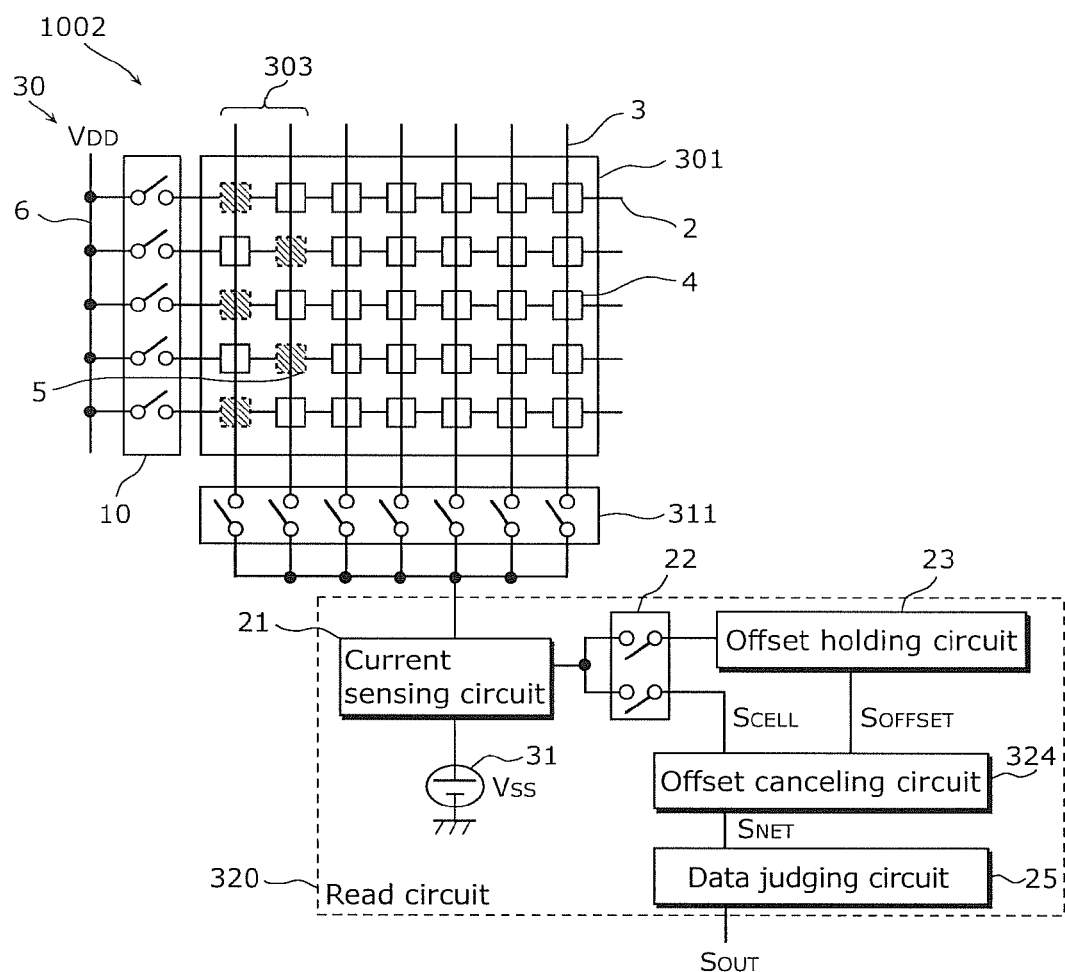
[FIG. 14] FIG. 14 schematically shows a structure of a nonvolatile semiconductor memory device according to Embodiment 3 of the present invention.

FIG. 14 shows, as an example, a structure of a nonvolatile semiconductor memory device 1002 according to Embodiment 3 of the present invention.

The nonvolatile semiconductor memory device 1002 according to this embodiment is configured such that particular bit lines are set as offset detection bit lines 303 (i.e., the plurality of bit lines include the plurality of offset detection bit lines 303) and the offset detection cells 5 are connected only to these offset detection bit lines 303. The offset detection cells 5 and the memory cells 4 which are connected to the offset detection bit lines 303 are arranged so that both the offset detection cell 5 and the memory cell 4 are connected to each of the offset detection bit lines 303 while the offset detection cells 5 are connected one-to-one with the respective word lines. Furthermore, all the offset detection bit lines 303 have the same number of offset detection cells 5 connected thereto. To put it another way, the offset detection cells 5 are arranged in a cross-point cell array 301 so that they correspond one-to-one with the word lines 2 and each of the offset detection cells 5 is provided for one of the offset detection bit lines 303.

Each of the memory cell 4 and the offset detection cell 5 may have the same structure as that described in Embodiment 1. Furthermore, the offset detection bit lines 303 each have the same structure as that of the other bit lines 3.

By connecting the offset detection cells 5 collectively to the specified offset detection bit lines 303, it is possible to clearly separate the bit lines which are used to detect the current $I_{CELL}$ and the bit lines which are used to detect the offset current $I_{OFFSET}$, and it is therefore also possible to completely separate the switches which are selected by a bit line selector 311 into those for detecting the current $I_{CELL}$ and those for detecting the offset current $I_{OFFSET}$.

In the case where the offset detection cells 5 are arranged over the whole cross-point cell array 201 as described in Embodiment 2 of the present invention, the bit line selector 311 needs to be designed so that a single bit line is selected from among all the bit lines according to the read-target cell.

In this regard, with the structure in this embodiment, a single bit line is selected from among the small number of offset detection bit lines 303, which produces an effect of facilitating the designing of a circuit (not shown) which selects a switch in the bit line selector 311.

The nonvolatile semiconductor memory device 1002 according to Embodiment 3 of the present invention includes, as shown in FIG. 14: the word lines 2 formed in parallel; the bit lines 3 and offset detection bit lines 303 formed in parallel in the direction in which the bit lines 3 and 303 cross the word lines 2; and the cross-point cell array 301 formed at the cross-points, in a planar view, of the word lines 2, the bit lines 3, and the offset detection bit lines 303 and between (i) the word lines 2 and (ii) the bit lines 3 and the offset detection bit lines 303.

Furthermore, the cross-point cell array 301 includes the plurality of memory cells 4 and the plurality of offset detection cells 5. Moreover, the offset detection cells 5 are arranged within the cross-point cell array 301 in such a manner that (i) each of the offset detection cells 5 is connected to one of the offset detection bit lines 303 and (ii) the offset detection cells are connected one-to-one with the word lines 2.

It is to be noted that although the offset detection bit lines 303 are collectively provided next to the bit lines 3 in the nonvolatile semiconductor memory device 1002 of FIG. 14, the arrangement of the offset detection bit lines 303 is not limited thereto, and the offset detection bit lines 303 may be dispersed so that one or more offset detection bit lines 303 are located between one and another of the bit lines 3. Furthermore, although the offset detection cells 5 are arranged so as to alternate with the memory cells 4 along the offset detection bit lines 303, the arrangement of the offset detection cells 5 is not limited thereto and may be other arrangement as long as it meets the above conditions (i) and (ii). Moreover, although the case where the number of offset detection bit lines 303 is two is shown which is desirable in that the percentage of the memory cells in the cross-point cell array 301 is highest, the number of offset detection bit lines 303 may be three or more when there is a demand for a higher signal-to-noise ratio of the read signal as will be described later.

The nonvolatile semiconductor memory device 1002 of FIG. 14 further includes the word line selector 10 and the bit line selector 311. The word line selector 10 is connected to the word lines 2 and selects one of the word lines 2 to connect only the selected one of the word lines (that is, a selected word line) to the power supply line 6 while leaving the other word lines in the unconnected state. To the power supply line 6, potential VDD is given from the power supply 30. The bit line selector 311 is connected to the bit lines 3 and the offset detection bit lines 303 and selects one of the bit lines 3 and the offset detection bit lines 303 to connect only the selected one to the current sensing circuit 21 while leaving the other bit lines and offset detection bit lines 303 in the unconnected state.

The nonvolatile semiconductor memory device 1002 of FIG. 14 further includes a read circuit 320. This read circuit 320 is a circuit which reads data stored in a read-target memory cell selected by the word line selector 10 and the bit line selector 311 from the cross-point cell array 301, and includes the current sensing circuit 21, the sensing signal selector 22, the offset holding circuit 23, an offset canceling circuit 324, and the data judging circuit 25.

Furthermore, to the current sensing circuit 21, potential VSS is given from the power supply 31. Thus, owing to the potential difference (VDD–VSS), a current flows through the word line 2 and the bit line 3 or the offset detection bit line 303. The current flowing in the bit line selector 11-side end of the bit line or the offset detection bit line selected by the bit line selector 311 is input to the current sensing circuit 21 through the bit line selector 311. The current sensing circuit 21 outputs an electrical signal that corresponds to a value of the input current, that is, an electrical signal that corresponds to a value of the current flowing through the selected bit line.

The sensing signal selector 22 has a function of selecting one of the offset holding circuit 23 and the offset canceling circuit 324 to which the electrical signal output from the current sensing circuit 21 is to be transmitted (that is, selecting where to output the electrical signal), as necessary (that is, according to an instruction given from a control circuit (not shown) included in the read circuit 320).

The offset holding circuit 23 has a function of holding a value of the electrical signal (the offset electrical signal $S_{OFFSET}$) received from the current sensing circuit 21 through the sensing signal selector 22, and outputting an electrical signal having the held value, as necessary, even when electrical signals are no longer received.

The offset canceling circuit 324 has a function of generating the electrical signal (the judging signal) $S_{NET}$ that corresponds to a value of an electrical signal obtained in a manner that, out of the two input electrical signals: the memory cell electrical signal $S_{CELL}$ received from the current sensing circuit 21 via the sensing signal selector 22 while the memory cell 4 is selected; and the offset electrical signal $S_{OFFSET}$ held in the offset holding circuit 23, the offset electrical signal is multiplied by γ and the resultant is then subtracted from the memory cell electrical signal. Here, γ is a constant which is determined for each of the offset detection bit lines 303 and is calculated according to the following expression.

$$\gamma = M/(M - N_i)$$

$N_i$: the number of offset detection cells connected to the i-th offset detection bit line M: the number of cells connected to each of the offset detection bit lines (the total number of memory cells and offset detection cells which are connected to a single offset detection bit line)

The data judging circuit 25 has a function of outputting an electrical signal $S_{OUT}$ that corresponds to "1" or "0" as memory data stored in the read-target memory cell, based on the electrical signal (the judging signal) $S_{NET}$ output from the offset canceling circuit 324.

[Read Method]

Subsequently, a reading method for use in the nonvolatile semiconductor memory device 1002 according to this embodiment is described with reference to FIGS. 15 and 16. The following describes the case where the number of offset detection bit lines is set to 2, and to each of the offset detection bit lines, the word-line offset detection cells the number of which is half the number of memory cells provided along the bit line are connected while the cells each having the same structure as that of the memory cell are connected for the remaining.

The following cites, as an example, the operation to read data from the read-target cell (the memory cell to be read) 4a and describes a sequence thereof.

Figure 15:
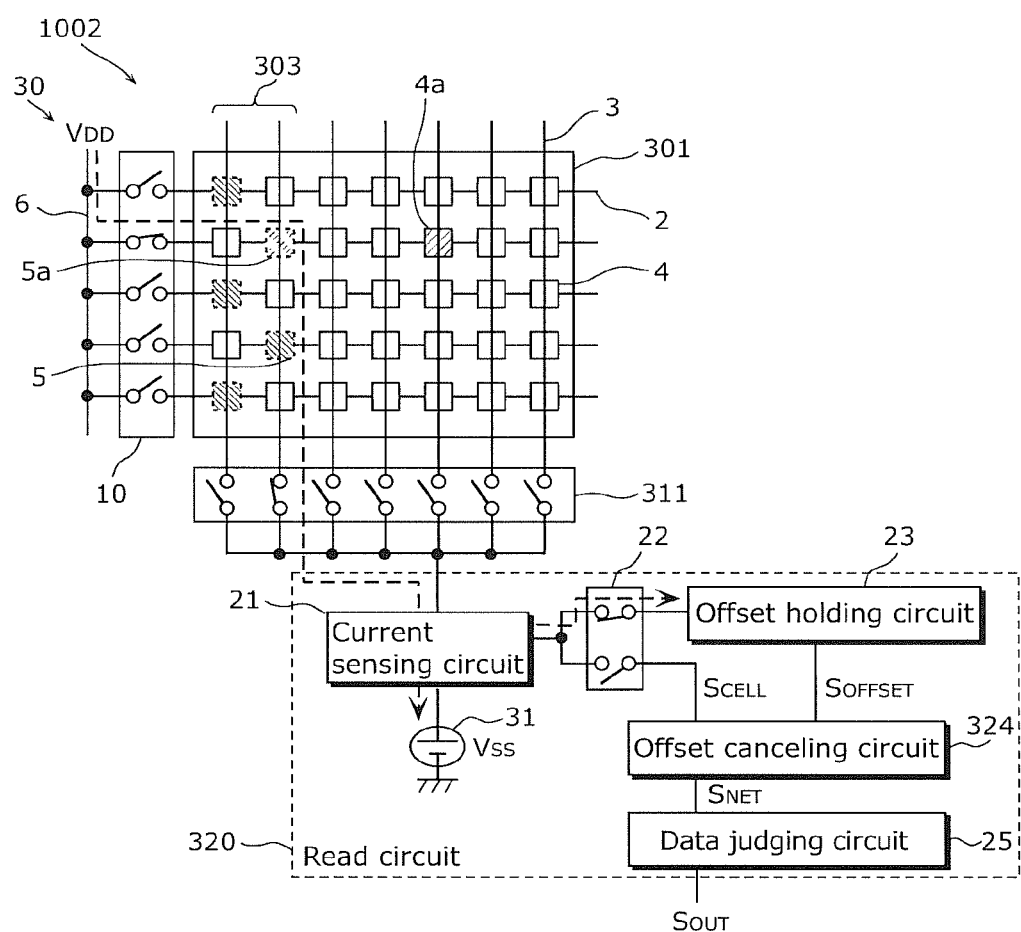
[FIG. 15]

First, as shown in FIG. 15, the word line selector 10 connects, to the power supply line 6, only the word line connected to the read-target cell 4a while leaving the other word lines in the unconnected state. The offset detection cell which is connected to the word line connected to this read-target cell 4a is referred herein to as the word-line offset detection cell 5a.

Subsequently, the bit line selector 311 connects, to the current sensing circuit 21, only the offset detection bit line connected to the word-line offset detection cell 5a while leaving the other offset detection bit lines and the bit lines in the unconnected state. With this, the current $I_{OFFSET}$ which flows in the bit line selector 311-side end of the offset detection bit line selected by the bit line selector 311 is input to the current sensing circuit 21, and the electrical signal (the offset electrical signal) $S_{OFFSET}$ that corresponds to a value of the current $I_{OFFSET}$ is output from the current sensing circuit 21. It is sufficient that this electrical signal output from the current sensing circuit 21 is an electrical signal which changes according to a value of the current input to the current sensing circuit 21, and the electrical signal can be freely selected in conformity with a type of a circuit determined to be used as each of the offset holding circuit 23 and the offset canceling circuit 324. For example, the amplitude of current or voltage or the pulse width or pulse density of the pulsed current or voltage may be used.

Subsequently, the sensing signal selector 22 outputs the electrical signal (the offset electrical signal) $S_{OFFSET}$ to the offset holding circuit 23 and causes the offset holding circuit 23 to hold the offset electrical signal $S_{OFFSET}$. At this time, the current sensing circuit 21 is disconnected from the offset canceling circuit 324 by the sensing signal selector 22 as shown in FIG. 15.

Figure 16:
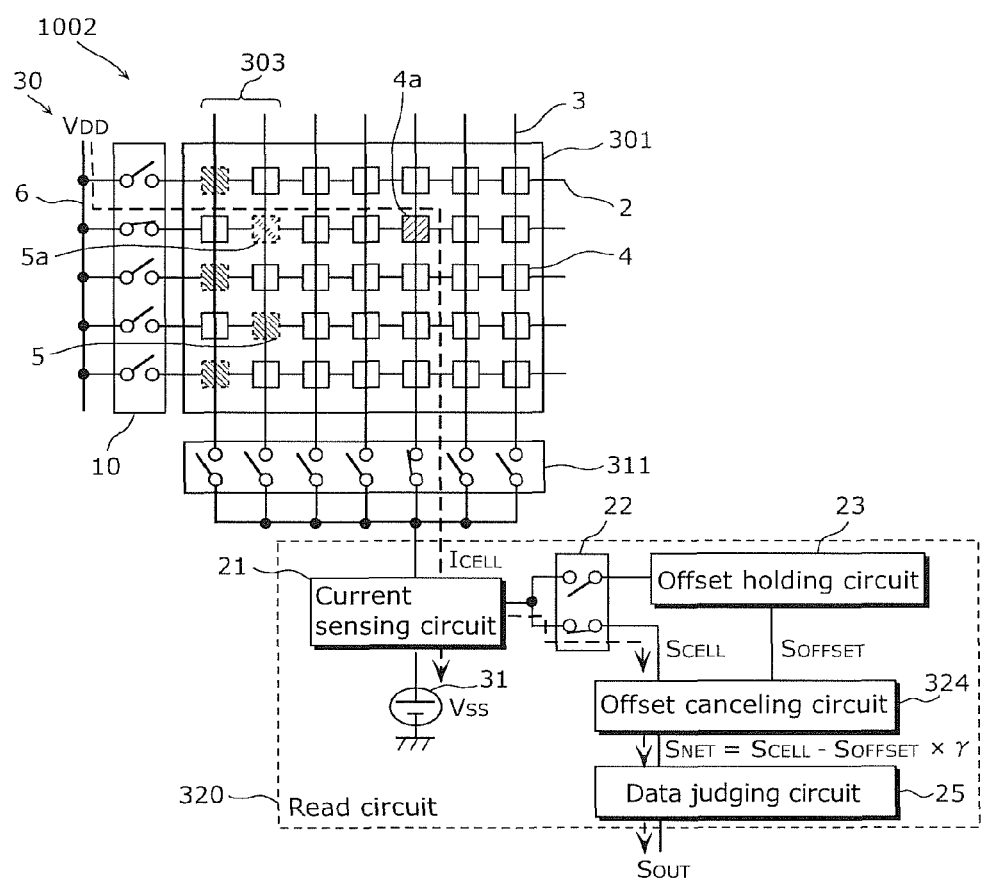
[FIG. 16]

Next, as shown in FIG. 16, the word line selector 10 connects, to the power supply line 6, only the word line connected to the read-target cell 4a while leaving the other word lines in the unconnected state. Subsequently, the bit line selector 311 connects, to the current sensing circuit 21, only the bit line connected to the read-target cell 4a while leaving the other bit lines and the offset detection bit lines in the unconnected state. With this, the current $I_{CELL}$ which flows in the bit line selector 311-side end of the bit line selected by the bit line selector 311 is input to the current sensing circuit 21, and the electrical signal (the memory cell electrical signal) $S_{CELL}$ that corresponds to a value of the current $I_{CELL}$ is output from the current sensing circuit 21.

Subsequently, the sensing signal selector 22 inputs the electrical signal (the memory cell electrical signal) $S_{CELL}$ to the offset canceling circuit 324. At this time, the current sensing circuit 21 is disconnected from the offset holding circuit 23 by the sensing signal selector 22 as shown in FIG. 16. Almost at the same time, the offset holding circuit 23 is caused to output the held electrical signal (the offset electrical signal) $S_{OFFSET}$ to the offset canceling circuit 324.

The offset canceling circuit 324 outputs an electrical signal (a judging signal) $S_{NET}$ ($=S_{CELL}-S_{OFFSET}\times 2$) which corresponds to a value of an electrical signal obtained by subtracting, from one of the two input electrical signals (the memory cell electrical signal $S_{CELL}$), a product of the other of the two input electrical signals (the offset electrical signal $S_{OFFSET}$) and γ (that is 2 herein), and inputs the resultant electrical signal to the data judging circuit 25.

The data judging circuit 25 judges, based on a value of the input electrical signal $S_{NET}$, whether the memory element included in the read-target cell 4a is in the high resistance (HR) state or in the low resistance (LR) state (i.e., the data stored in the read-target cell 4a), and outputs, as an output signal of the read circuit 320, an electrical signal $S_{OUT}$ that corresponds to "1" or "0" to outside.

In the nonvolatile semiconductor memory device 1002 according to Embodiment 3 of the present invention, to the offset detection bit line 303, the word-line offset detection cells 5a the number of which is half the number of memory cells provided along the bit line are connected while the memory cells 4 each having the same structure as that of the memory cell 4 are connected for the remaining. To the memory cells 4 connected to this offset detection bit line 303, no data is written and it is sufficient that they have "0" or "1" written. Specifically, in this embodiment, the offset current $I_{OFFSET}$ detected by the current sensing circuit 21 when the word-line offset detection cell 5a is selected is approximately half the sneak current $I_{SNEAK}$ included in the current $I_{CELL}$ detected by the current sensing circuit 21 when the read-target cell 4a is selected ($T_{OFFSET} \approx I_{SNEAK}/2$). The offset canceling circuit 324 outputs the judging signal $S_{NET}$ which corresponds to a value obtained by subtracting, from the memory cell electrical signal $S_{CELL}$ which corresponds to a value of the current $I_{CELL}$, a product of 2 and the offset electrical signal $S_{OFFSET}$ which corresponds to a value of the offset current $I_{OFFSET}$, with the result that the signal-to-noise ratio and the accuracy for reading in the nonvolatile semiconductor memory device 1002 are higher, as compared to the case where the memory cell electrical signal $S_{CELL}$ is used directly as a judging signal.

[Flowchart]

Figure 17:
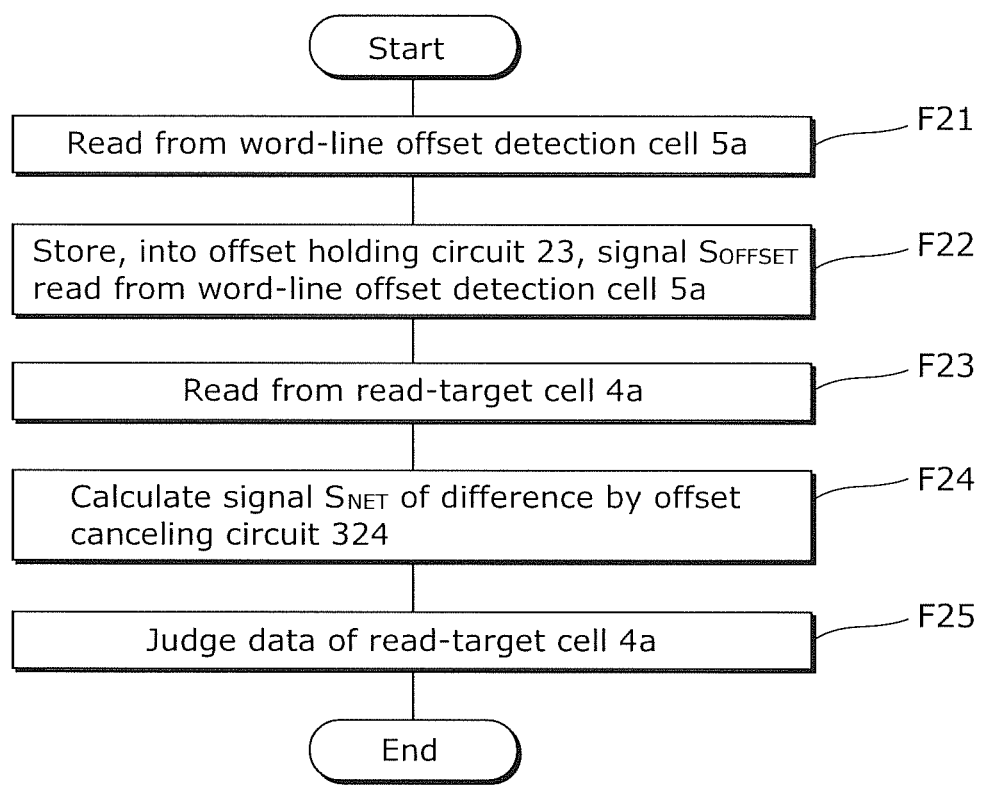
[FIG. 17]
Figure 18:
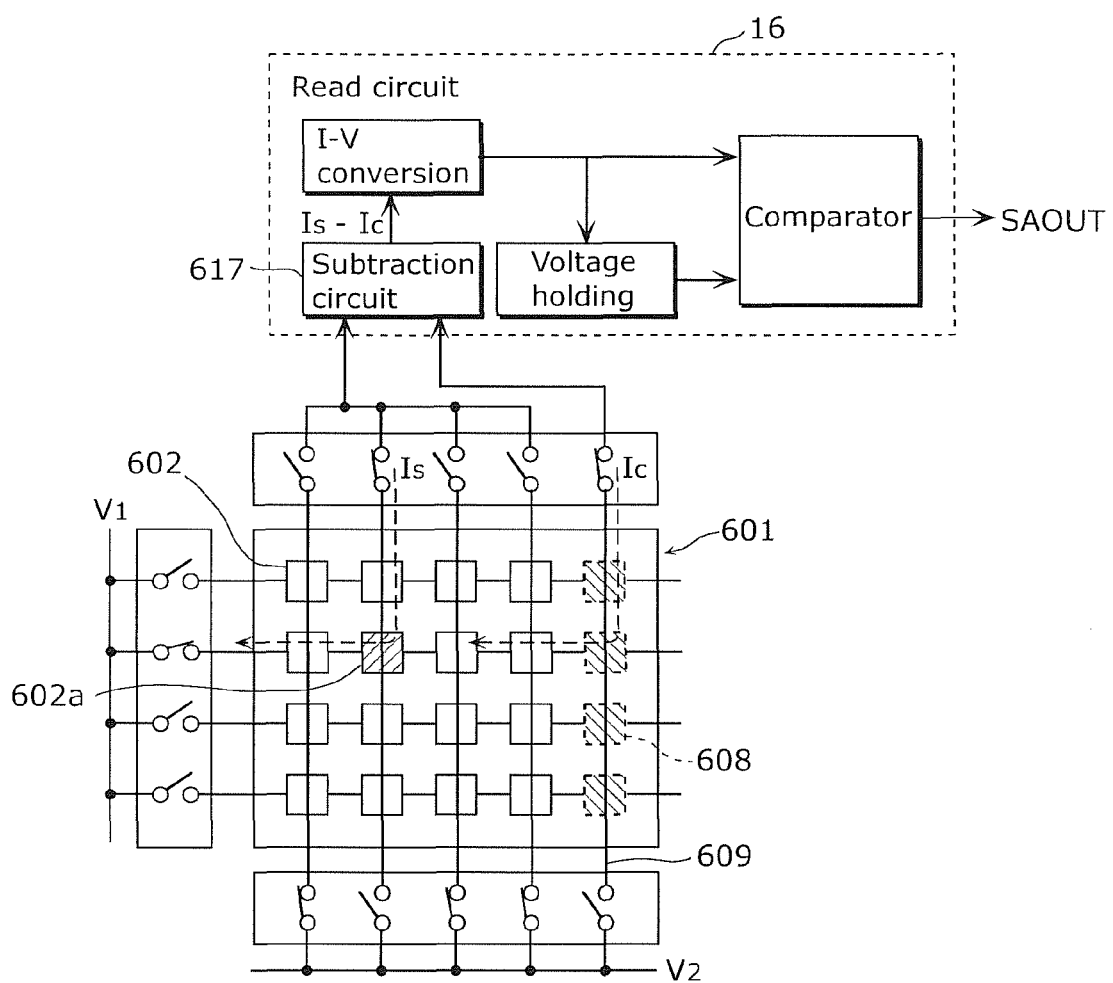
[FIG. 18]

FIG. 17 is a flowchart showing a flow for reading in the nonvolatile semiconductor memory device 1002 according to Embodiment 3 of the present invention.

First, upon request for the reading operation for the memory cell (the read-target cell) 4a, the word-line offset detection cell 5a is selected to detect the offset electrical signal $S_{OFFSET}$ (F21; the first half of an offset detecting process), and the detected signal is stored into the offset holding circuit 23 (F22; the latter half of the offset detecting process).

Subsequently, the read-target cell 4a is selected to read a signal (the memory cell electrical signal) (F23; a memory cell detecting process), and by the offset canceling circuit 324, the electrical signal (the judging signal) $S_{NET}$ is calculated (F24; an offset canceling process).

Subsequently, by the data judging circuit 25, the data stored in the read-target cell 4a is judged using the electrical signal (the judging signal) $S_{NET}$ (F25; a data judging process). With that, the operation to read data is completed.

Although the above describes an operation of the nonvolatile semiconductor memory device 1002 with two offset detection bit lines 303 to each of which the word-line offset detection cells the number of which is half the number of memory cells provided along the bit lines are connected, the present invention is not limited thereto. In a more extended expression, the following is satisfied.

$$I_{OFFSET} \approx I_{SNEAK} \times M/(M-N_i)$$

$N_i$: the number of offset detection cells connected to the i-th offset detection bit line M: the number of cells connected to each of the offset detection bit lines (the total number of memory cells and offset detection cells which are connected to a single offset detection bit line)

Thus, when the factor which multiplies the offset electrical signal $S_{OFFSET}$ to calculate the difference in the offset canceling circuit 324 is $M/(M-N_i)$, the same or like effects can be obtained. As the number of offset detection bit lines 303 increases and the number of offset detection cells $N_i$ connected to a single offset detection bit line 303 decreases, the difference between $I_{OFFSET}$ and $I_{SNEAK} \times M/(M-N_1)$ decreases, which allows an increase in the signal-to-noise ratio.

Furthermore, although the above describes the example where the offset detection cells are connected only to the particular offset detection bit lines 303, the same or the like effects can be obtained even when particular word lines are set as offset detection word lines, and the offset detection cells are arranged within the cross-point cell array in a manner that (i) each of the offset detection cells is connected to any of the offset detection word lines and (ii) the offset detection cells are connected one-to-one with the bit lines.

Although a nonvolatile semiconductor memory device and a read method therefor according to the present invention have been described based on the embodiments and the variation, the present invention is not limited these embodiments and variation. The present invention includes, without departing from the principles and spirit thereof, an embodiment obtained by making various modifications that those skilled in the art could think of, to these embodiments and variation, or an embodiment obtained by a given combination of constituents in these embodiments and variation.

For example, although it is determined whether or not there is any change in the memory data stored in the cross-point cell array since the last time a signal was stored into the offset holding circuit (F1) as indicated in the flowchart of FIG. 7 in the read method in Embodiment 1, the present invention is not limited to this process, and it may be that every time data is read from the memory call, the offset electrical signal is read from the offset detection cell and then is stored into the offset holding circuit without making the above determination. By doing so, it is no longer necessary to determine whether or not there is any change in the memory data stored in the cross-point cell array, which eliminates the need of management of reading into the cross-point cell array.

On the other hand, in Embodiment 2, Variation thereof, and Embodiment 3, whether or not there is any change in the memory data stored in the cross-point cell array is not determined when data is read from the memory cell, but it may be that, as in the case of Embodiment 1, this determination is made and only when there is a change in the stored data, the offset electrical signal which is held in the offset holding circuit is updated.

In addition, the nonvolatile semiconductor memory device according to an implementation of the present invention does not necessarily include the word line selector, the bit line selector, and the read circuit, as long as the nonvolatile semiconductor memory device includes at least the cross-point cell array. This cross-point cell array includes: the memory cell which includes the memory element that operates as a memory; and the offset detection cell which has a resistance value higher than the resistance value of the memory element in a high resistance state which is a state of the memory element when operating as a memory, and in this structure, the sneak current can therefore be detected with high accuracy unlike a conventional cross-point cell array which includes a memory cell and a dummy cell that are not different in structure.

Furthermore, although a circuit for writing into the memory cell and a circuit which performs the initial breakdown are not explicitly described in the nonvolatile semiconductor memory device according to each of the above embodiments and variation, it goes without saying that such circuits may be provided.

[Industrial Applicability]

The present invention is useful as a nonvolatile semiconductor memory device, for example, in various electronic devices such as digital home appliances, memory cards, mobile phones, and personal computers, as a nonvolatile semiconductor memory device that can solve problems, especially, a decrease in the signal-to-noise ratio of a read signal due to the sneak current, which used to be an impediment to providing a nonvolatile semiconductor memory device with a cross-point structure that makes miniaturization and capacity increase possible, but is difficult to take a measure with a conventional device structure.

[Reference Signs List]

1, 201, 301 Cross-point cell array
2 Word line
3 Bit line
4 Memory cell
4a Read-target cell
5, 51, 52, 53, 54 Offset detection cell
5a Word-line offset detection cell
5b Bit-line offset detection cell
6 Power supply line
10 Word line selector
11, 311 Bit line selector
16, 20, 220, 320 Read circuit
21 Current sensing circuit
22, 222 Sensing signal selector
23 Offset holding circuit
24, 224, 324 Offset canceling circuit
25 Data judging circuit
30 Power supply VDD
31 Power supply VSS
100, 501 Interlayer insulating film
110 First via
111 Memory element
112 Second via
223a First offset holding circuit
223b Second offset holding circuit
303 Offset detection bit line
511 First electrode
512 Second electrode
513 Third electrode
521 High oxygen deficiency layer
522 Low oxygen deficiency layer
530 Semiconductor layer
570 Variable resistance element
571 Diode
572 Memory element
601 Cross-point cell array
602 Memory cell
602a Selected cell
608 Dummy cell
609 Dummy bit line
617 Subtraction circuit
1000, 1001, 1001a, 1002 Nonvolatile semiconductor memory device

The invention claimed is:

1. A nonvolatile semiconductor memory device comprising:
  word lines formed in parallel in a first plane;
  bit lines formed in parallel in a second plane and three-dimensionally crossing the word lines, the second plane being parallel to the first plane; and
  a cross-point cell array including cells each provided at a corresponding one of three-dimensional cross-points of the word lines and the bit lines,
  wherein the cells include:
  a memory cell including a memory element that operates as a memory by reversibly changing in resistance value between at least two states based on an electrical signal applied between a corresponding one of the word lines and a corresponding one of the bit lines; and
  an offset detection cell having a resistance value that is, irrespective of an electrical signal applied between a corresponding one of the word lines and a corresponding one of the bit lines, higher than the resistance value of the memory element in a high resistance state which is a state of the memory element when operating as the memory.

2. The nonvolatile semiconductor memory device according to claim 1, further comprising:
  a word line selector that selects one of the word lines as a selected word line;
  a bit line selector that selects one of the bit lines as a selected bit line; and
  a read circuit that judges memory data stored in a read-target memory cell, based on a judging signal which corresponds to a value obtained by subtracting a value of an offset electrical signal from a value of a memory cell electrical signal, the read-target memory cell being selected by the word line selector and the bit line selector from the cross-point cell array, the offset electrical signal being an electrical signal determined from a value of a current flowing through a second selected bit line when a read voltage is applied between a second selected word line and the second selected bit line, the memory cell electrical signal being an electrical signal that corresponds to a value of a current flowing through a first selected bit line when the read voltage is applied between a first selected word line and the first selected bit line, the second selected word and bit lines corresponding to the offset detection cell that is at least one in number, and the first selected word and bit lines corresponding to the read-target memory cell.

3. The nonvolatile semiconductor memory device according to claim 2,
  wherein the read circuit includes:
  a current sensing circuit that outputs (i) the memory cell electrical signal that corresponds to the value of the current flowing through the first selected bit line and (ii) the offset electrical signal that corresponds to the value of the current flowing through the second selected bit line;
  a sensing signal selector that selects where to output the memory cell electrical signal and the offset electrical signal which are output from the current sensing circuit;
  an offset holding circuit that holds the value of the offset electrical signal received from the current sensing circuit via the sensing signal selector;
  an offset canceling circuit that calculates and outputs the judging signal, the calculation being performed using (i) the value of the memory cell electrical signal received from the current sensing circuit via the sensing signal selector and (ii) a value of an electrical signal which is equal to the value of the offset electrical signal held in the offset holding circuit; and
  a data judging circuit that judges, based on a value of the judging signal, the memory data stored in the read-target memory cell.

4. The nonvolatile semiconductor memory device according to claim 1,
  wherein the offset detection cell includes offset detection cells arranged in the cross-point cell array in a one-to-one correspondence with the word lines and in a one-to-one correspondence with the bit lines.

5. The nonvolatile semiconductor memory device according to claim 4, further comprising:
  a word line selector that selects one of the word lines as a selected word line;
  a bit line selector that selects one of the bit lines as a selected bit line; and
  a read circuit that judges memory data stored in a read-target memory cell, based on a judging signal which corresponds to a value obtained by subtracting a value of an offset electrical signal from a value of a memory cell electrical signal, the read-target memory cell being selected from the cross-point cell array, the offset electrical signal corresponding to a value of a current flowing through a second selected bit line when a read voltage is applied between a first selected word line and the second selected bit line, the memory cell electrical signal corresponding to a value of a current flowing through a first selected bit line when the read voltage is applied between the first selected word line and the first selected bit line, the second selected bit line corresponding to the offset detection cell provided for the first selected word line, and the first selected word and bit lines corresponding to the read-target memory cell.

6. The nonvolatile semiconductor memory device according to claim 4, further comprising:
  a word line selector that selects one of the word lines as a selected word line;
  a bit line selector that selects one of the bit lines as a selected bit line; and
  a read circuit that judges memory data stored in a read-target memory cell, based on a judging signal which corresponds to a value obtained by subtracting a value of an offset electrical signal from a value of a memory cell electrical signal, the read-target memory cell being selected from the cross-point cell array, the offset electrical signal corresponding to a value of a current flowing through a first selected bit line when a read voltage is applied between a second selected word line and the first selected bit line, the memory cell electrical signal corresponding to a value of a current flowing through the first selected bit line when the read voltage is applied between a first selected word line and the first selected bit line, the first selected word and bit lines corresponding to the read-target memory, and the second selected word line corresponding to the offset detection cell provided for the first selected bit line.

7. The nonvolatile semiconductor memory device according to claim 4, further comprising:
  a word line selector that selects one of the word lines as a selected word line;
  a bit line selector that selects one of the bit lines as a selected bit line; and
  a read circuit that judges memory data stored in a read-target memory cell, based on a judging signal which corresponds to a value obtained by subtracting a value of an offset electrical signal from a value of a memory cell electrical signal, the read-target memory cell being selected from the cross-point cell array, the value of the offset electrical signal being determined from a value of a first offset electrical signal and a value of a second offset electrical signal, the memory cell electrical signal corresponding to a value of a current flowing through a first selected bit line when a read voltage is applied between a first selected word line and the first selected bit line, the first offset electrical signal being an electrical signal corresponding to a value of a current flowing through a second selected bit line when the read voltage is applied between the first selected word line and the second selected bit line, the second offset electrical signal being an electrical signal corresponding to a value of a current flowing through the first selected bit line when the read voltage is applied between a second selected word line and the first selected bit line, the first selected word and bit lines corresponding to the read-target memory cell, the second selected bit line corresponding to a first offset detection cell provided for the first selected word line, and the second selected word line corresponding to a second offset detection cell provided for the first selected bit line.

8. The nonvolatile semiconductor memory device according to claim 7,
wherein the read circuit calculates, as the judging signal, $S_{NET}$ satisfying any of the following relationships:

$$S_{NET}=S_{CELL}-(S_{OFFSET1}+S_{OFFSET2})/2;$$

$$S_{NET}=S_{CELL}-\text{MAX}(S_{OFFSET1},S_{OFFSET2});$$

$$S_{NET}=S_{CELL}-\text{MIN}(S_{OFFSET1},S_{OFFSET2}); \text{ and}$$

$$S_{NET}=S_{CELL}-(\alpha \times S_{OFFSET1}+\beta \times S_{OFFSET2})/(\alpha+\beta),$$

where $S_{CELL}$ is the value of the memory cell electrical signal, $S_{OFFSET1}$ is the value of the first offset electrical signal, $S_{OFFSET2}$ is the value of the second offset electrical signal, and each of $\alpha$ and $\beta$ is a given constant.

9. The nonvolatile semiconductor memory device according to claim 7,
wherein the read circuit includes:
a current sensing circuit that outputs (i) the memory cell electrical signal that corresponds to the value of the current flowing through the first selected bit line, (ii) the first offset electrical signal that corresponds to the value of the current flowing through the second selected bit line, and (iii) the second offset electrical that corresponds to the value of the current flowing through the first selected bit line;
a sensing signal selector that selects where to output the memory cell electrical signal, the first offset electrical signal, and the second offset electrical signal which are output from the current sensing circuit;
a first offset holding circuit that holds the value of the first offset electrical signal received from the current sensing circuit via the sensing signal selector;
a second offset holding circuit that holds the value of the second offset electrical signal received from the current sensing circuit via the sensing signal selector;
an offset canceling circuit that calculates and outputs the judging signal, the calculation being performed using (i) the value of the memory cell electrical signal received from the current sensing circuit via the sensing signal selector, (ii) the value of the first offset electrical signal held in the first offset holding circuit, and (iii) the value of the second offset electrical signal held in the second offset holding circuit; and
a data judging circuit that judges, based on a value of the judging signal, the memory data stored in the read-target memory cell.

10. A read method for the memory cell in the nonvolatile semiconductor memory device according to claim 7, the read method comprising:
(i) selecting a word line and a bit line between which a first offset detection cell is provided, (ii) detecting a value of a first offset electrical signal that corresponds to a value of a current flowing through the selected bit line, and (iii) storing the value of the first offset electrical signal into a first offset holding circuit;
(i) selecting a word line and a bit line between which a second offset detection cell is provided, (ii) detecting a value of a second offset electrical signal that corresponds to a value of a current flowing through the selected bit line, and (iii) storing the value of the second offset electrical signal into a second offset holding circuit;
(i) selecting a word line and a bit line between which a read-target memory cell is provided, and (ii) detecting a value of a memory cell electrical signal that corresponds to a value of a current flowing through the selected bit line;
calculating a judging signal by an offset canceling circuit using the value of the memory cell electrical signal, the value of the first offset electrical signal held in the first offset holding circuit, and the value of the second offset electrical signal held in the second offset holding circuit; and
judging, based on a value of the judging signal, data stored in the read-target memory cell, by a data judging circuit.

11. The nonvolatile semiconductor memory device according to claim 1,
wherein the bit lines include offset detection bit lines, and the offset detection cell includes offset detection cells which are arranged in the cross-point cell array in a one-to-one correspondence with the word lines and each of which is provided for one of the offset detection bit lines.

12. The nonvolatile semiconductor memory device according to claim 11, further comprising:
a word line selector that selects one of the word lines as a selected word line;
a bit line selector that selects one of the bit lines as a selected bit line; and
a read circuit that judges memory data stored in a read-target memory cell, based on a judging signal which corresponds to a value obtained by subtracting a value of an offset electrical signal from a value of a memory cell electrical signal, the read-target memory cell being selected by the word line selector and the bit line selector from the cross-point cell array, the offset electrical signal being an electrical signal determined from a value of a current flowing through a second selected bit line when a read voltage is applied between a second selected word line and the second selected bit line, the memory cell electrical signal being an electrical signal that corresponds to a value of a current flowing through a first selected bit line when the read voltage is applied between a first selected word line and the first selected bit line, the second selected word and bit lines corresponding to the offset detection cell that is at least one in number, and the first selected word and bit lines corresponding to the read-target memory cell, wherein the read circuit calculates the judging signal by subtracting, from the value of the memory cell electrical signal, the value of the offset electrical signal that is a value obtained by multiplying the value of the current flowing through the second selected bit line by a constant $M/(M-N_i)$ where M is a total number of cells which are connected to each of the offset detection bit lines and include the memory cell and the offset detection cell, and $N_i$ is the number of the offset detection cells connected to an i-th offset detection bit line among the offset detection bit lines.

13. The nonvolatile semiconductor memory device according to claim 1, wherein the word lines include offset detection word lines, and the offset detection cell includes offset detection cells which are arranged in the cross-point cell array in a one-to-one correspondence with the bit lines and each of which is provided for one of the offset detection word lines.

14. The nonvolatile semiconductor memory device according to claim 13, further comprising:

a word line selector that selects one of the word lines as a selected word line;

a bit line selector that selects one of the bit lines as a selected bit line; and a read circuit that judges memory data stored in a read-target memory cell, based on a judging signal which corresponds to a value obtained by subtracting a value of an offset electrical signal from a value of a memory cell electrical signal, the read-target memory cell being selected by the word line selector and the bit line selector from the cross-point cell array, the offset electrical signal being an electrical signal determined from a value of a current flowing through a second selected bit line when a read voltage is applied between a second selected word line and the second selected bit line, the memory cell electrical signal being an electrical signal that corresponds to a value of a current flowing through a first selected bit line when the read voltage is applied between a first selected word line and the first selected bit line, the second selected word and bit lines corresponding to the offset detection cell that is at least one in number, and the first selected word and bit lines corresponding to the read-target memory cell, wherein the read circuit calculates the judging signal by subtracting, from the value of the memory cell electrical signal, the value of the offset electrical signal that is a value obtained by multiplying the value of the current flowing through the second selected bit line by a constant $M/(M-N_i)$ where M is a total number of cells which are connected to each of the offset detection word lines and include the memory cell and the offset detection cell, and $N_i$ is the number of the offset detection cells connected to an i-th offset detection word line among the offset detection word lines.

15. The nonvolatile semiconductor memory device according to claim 1, wherein the offset detection cell has a structure obtained by removing, from the memory cell, one or both of vias that electrically connect the memory element with the corresponding word line and the corresponding bit line.

16. The nonvolatile semiconductor memory device according to claim 1, wherein the offset detection cell has a structure obtained by removing the memory element from the memory cell, or a structure obtained by removing, from the memory cell, the memory element and one or both of vias that electrically connect the memory element with the corresponding word line and the corresponding bit line.

17. The nonvolatile semiconductor memory device according to claim 1, wherein the memory element includes a variable resistance memory element which has a layered structure including a first electrode, a variable resistance layer, and a second electrode.

18. The nonvolatile semiconductor memory device according to claim 17, wherein the first electrode comprises any of tantalum nitride (TaN), titanium nitride (TiN), and tungsten (W), the second electrode comprises any of platinum (Pt), iridium (Ir), and palladium (Pd), or an alloy including Pt, Ir, or Pd, the variable resistance layer includes a low oxygen deficiency layer and a high oxygen deficiency layer, the low oxygen deficiency layer comprises at least one of an oxygen-deficient tantalum oxide film, an oxygen-deficient iron oxide film, an oxygen-deficient hafnium oxide film, and an oxygen-deficient zirconium oxide, the high oxygen deficiency layer comprises at least one of an oxygen-deficient tantalum oxide film, an oxygen-deficient iron oxide film, an oxygen-deficient hafnium oxide film, and an oxygen-deficient zirconium oxide, and the low oxygen deficiency layer is less than the high oxygen deficiency layer in degree of oxygen deficiency.

19. The nonvolatile semiconductor memory device according to claim 18, wherein the memory cell is a cell treated, after manufacture, with initial breakdown for causing the memory element to operate as the memory, and the offset detection cell is a cell which has the same structure as the memory cell and has not been treated with the initial breakdown after manufacture.

20. The nonvolatile semiconductor memory device according to claim 1, wherein the memory element includes a variable resistance memory element and a switching element connected in series with the variable resistance memory element.

21. The nonvolatile semiconductor memory device according to claim 20, wherein the switching element is a diode which has a layered structure including a first metal electrode, a semiconductor layer, and a second metal electrode.

22. The nonvolatile semiconductor memory device according to claim 21, wherein each of the first metal electrode and the second metal electrode comprises any of tantalum nitride (TaN), titanium nitride (TiN), and tungsten (W), and the semiconductor layer comprises nitrogen-deficient silicon nitride.

23. A read method for the memory cell in the nonvolatile semiconductor memory device according to claim 1, the read method comprising:

(i) selecting a word line and a bit line between which an offset detection cell is provided, (ii) detecting a value of an offset electrical signal that corresponds to a value of a current flowing through the selected bit line, and (iii) storing the value of the offset electrical signal into an offset holding circuit;

(i) selecting a word line and a bit line between which a read-target memory cell is provided, and (ii) detecting a value of a memory cell electrical signal that corresponds to a value of a current flowing through the selected bit line;

calculating a judging signal by an offset canceling circuit using the value of the memory cell electrical signal and the value of the offset electrical signal held in the offset holding circuit; and judging, based on a value of the judging signal, data stored in the read-target memory cell, by a data judging circuit.

24. The read method according to claim 23, further comprising determining, before the (i) selecting, (ii) detecting, and (iii) storing, whether data stored in the memory cell included in a cross-point cell array has been changed since detection of a value of an offset electrical signal that corresponds to a value of a current flowing through a second selected bit line when a read voltage is applied between a second selected word line and the second selected bit line, wherein, in the (iii) storing of the value of the offset electrical signal, the offset electrical signal is stored into the offset holding circuit when it is determined in the determining that the data has been changed, and in the (ii) detecting of a value of a memory cell electrical signal, the value of the memory cell electrical signal is detected after completion of the determining when it is determined in the determining that the data has not been changed, or after completion of the (ii) detecting of a value of an offset electrical signal when it is determined in the determining that the data has been changed.

* * * * *